(12) United States Patent
Park

(10) Patent No.: US 10,978,558 B2
(45) Date of Patent: Apr. 13, 2021

(54) SEMICONDUCTOR DEVICE AND METHOD FOR FABRICATING A SEMICONDUCTOR DEVICE

(71) Applicant: SK hynix Inc., Icheon-si (KR)

(72) Inventor: In-Su Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/459,825

(22) Filed: Jul. 2, 2019

(65) Prior Publication Data
US 2020/0119145 A1 Apr. 16, 2020

(30) Foreign Application Priority Data
Oct. 15, 2018 (KR) .................. 10-2018-0122657

(51) Int. Cl.
| | |
|---|---|
| H01L 27/11582 | (2017.01) |
| H01L 29/10 | (2006.01) |
| H01L 27/1157 | (2017.01) |
| H01L 21/762 | (2006.01) |

(52) U.S. Cl.
CPC ........ H01L 29/1037 (2013.01); H01L 21/762 (2013.01); H01L 27/1157 (2013.01); H01L 27/11582 (2013.01)

(58) Field of Classification Search
CPC ............... H01L 29/1037; H01L 21/762; H01L 27/1157; H01L 27/11582; H01L 27/115–11597; H01L 2924/14511; H01L 29/42324–42336; H01L 29/788–7889; H01L 21/76224; G11C 14/0018; G11C 16/04–0491; G11C 16/06–3495; G11C 2216/12–30
See application file for complete search history.

(56) References Cited

U.S. PATENT DOCUMENTS

| | | | |
|---|---|---|---|
| 9,209,199 B2 | 12/2015 | Simsek-Ege et al. | |
| 9,219,070 B2 | 12/2015 | Thimmegowda et al. | |
| 9,627,396 B2 | 4/2017 | Son et al. | |
| 9,859,293 B2 | 1/2018 | Lee | |
| 2010/0261330 A1* | 10/2010 | Nansei ................ | H01L 27/0207 438/382 |

(Continued)

*Primary Examiner* — Shahed Ahmed
(74) *Attorney, Agent, or Firm* — William Park & Associates Ltd.

(57) ABSTRACT

A semiconductor device includes a first stacked structure including word lines and dielectric layers alternately stacked over a substrate. The semiconductor device also includes a plurality of first vertical channel structures formed through the first stacked structure and a second stacked structure including gate electrodes and dielectric layers alternately stacked over the first stacked structure. The semiconductor device further includes a plurality of second vertical channel structures formed through the second stacked structure, wherein the plurality of second vertical channel structures are respectively connected to the plurality of first vertical channel structures. The semiconductor device additionally includes an isolating layer for isolating the plurality of second vertical channel structures into first and second regions. Both sidewalls of the isolating layer contact sidewalls of the second vertical channel structures of the plurality of second vertical channel structures positioned at the boundary between the first and second regions.

16 Claims, 28 Drawing Sheets

(56) References Cited

U.S. PATENT DOCUMENTS

2015/0340371 A1* 11/2015 Lue .................. H01L 27/11582
                                                    257/324
2017/0084624 A1*  3/2017 Lee .................... H01L 27/1157
2018/0019257 A1   1/2018 Son et al.
2019/0312055 A1* 10/2019 Baek ........................ G11C 5/06

* cited by examiner

SEMICONDUCTOR DEVICE AND METHOD FOR FABRICATING A SEMICONDUCTOR DEVICE

CROSS-REFERENCE TO RELATED APPLICATION

This application claims priority under 35 U.S.C. § 119 to Korean Patent Application No. 10-2018-0122657, filed on Oct. 15, 2018, which is incorporated herein by reference in its entirety.

BACKGROUND

1. Field

Embodiments relate to a semiconductor device, and more particularly, to a vertical semiconductor device and a method for fabricating a vertical semiconductor device.

2. Discussion of the Related Art

A semiconductor device may include a memory cell array including a plurality of memory cells. The memory cell array may include memory cells arranged in various structures. To improve the degree of integration of the semiconductor device, the memory cells may be three-dimensionally arranged over a substrate.

SUMMARY

In accordance with an embodiment, a method for fabricating a semiconductor device may include alternately stacking dielectric layers and sacrificial layers over a bottom structure and etching the dielectric layers and the sacrificial layers to form a plurality of channel holes spaced apart from each other. The method also includes filling the plurality of channel holes with pad materials, respectively, and etching the dielectric layers and the sacrificial layers to form an isolating trench for isolating the pad materials into first and second regions, wherein the isolating trench is formed to be self-aligned with the pad materials positioned at a boundary between the first and second regions. The method further includes filling the isolating trench with an isolating layer. The method further includes after filling the isolating trench with the isolating layer, forming a plurality of pads by recessing the pad materials; forming vertical channel structures over the plurality of pads, respectively; etching the dielectric layers and the sacrificial layers to form a slit for isolating the plurality of vertical channel structures on a block basis; and replacing the sacrificial layers with a conductive material through the slit. The isolating trench comprises linear shape sidewalls and round shape sidewalls which are continuous with each other. The round shape sidewalls contact sidewalls of the pad materials positioned at the boundary between the first and second regions. Etching the dielectric layers and the sacrificial layers to form an isolating trench comprises forming a mask having an opening which partially overlaps the pad materials positioned at the boundary between the first and second regions; and etching the dielectric layers and the sacrificial layers using the mask and the pad materials as an etch barrier. Opening of the mask is formed to have sidewalls which partially overlap the pad materials positioned at the boundary between the first and second regions. Forming a mask having an opening comprises forming the opening of the mask with zigzag-shape sidewalls. The pad materials comprise a material having an etch selectivity with respect to the dielectric layers and the sacrificial layers. The pad materials comprise at least one of polysilicon and titanium nitride. The isolating layer comprises linear shape sidewalls and round shape sidewalls which are continuous with each other, wherein the pad materials are partially surrounded by the linear shape sidewalls.

In accordance with an embodiment, a method for fabricating a semiconductor device may include alternately stacking dielectric layers and sacrificial layers over a bottom structure, etching the dielectric layers and the sacrificial layers to form a plurality of channel holes, forming first vertical channel structures to fill a lower portion of the respective channel holes, and filling an upper portion of the plurality of channel holes with pad materials, respectively. The method also includes etching the dielectric layers and the sacrificial layers to form an isolating trench for isolating the pad materials into first and second regions, wherein the isolating trench is formed to be self-aligned with the pad materials positioned at a boundary between the first and second regions. The method further includes filling the isolating trench with an isolating layer. The method further includes after filling the isolating trench with the isolating layer, forming a plurality of pads by recessing the pad materials; forming second vertical channel structures over the plurality of pads, respectively, wherein the first vertical channel structures, the pads and the second vertical channel structures are sequentially stacked, etching the dielectric layers and the sacrificial layers to form a slit for isolating the sequential stacks on a block basis; and replacing the sacrificial layers with a conductive material through the slit. The isolating trench comprises linear shape sidewalls and round shape sidewalls which are continuous with each other. The round shape sidewalls contact sidewalls of the pad materials positioned at the boundary between the first and second regions. Etching the dielectric layers and the sacrificial layers to form an isolating trench comprises forming a mask having an opening which partially overlaps the pad materials positioned at the boundary between the first and second regions; and etching the dielectric layers and the sacrificial layers using the mask and the pad materials as an etch barrier. Opening of the mask is formed to have zigzag-shape sidewalls which partially overlap the pad materials positioned at the boundary between the first and second regions. The isolating layer comprises linear shape sidewalls and round shape sidewalls which are continuous with each other, wherein the round shape sidewalls contact sidewalls of the pad materials positioned at the boundary between the first and second regions. The pad materials comprise a material having an etch selectivity with respect to the dielectric layers and the sacrificial layers. The pad materials comprise at least one of polysilicon and titanium nitride. The first vertical channel structures are a part of a cell string, and wherein the second vertical channel structures are a part of a select transistor for selecting the cell string.

Also in accordance with an embodiment, a semiconductor device includes a first stacked structure including word lines and dielectric layers alternately stacked over a substrate. The semiconductor device also includes a plurality of first vertical channel structures formed through the first stacked structure and a second stacked structure including gate electrodes and dielectric layers alternately stacked over the first stacked structure. The semiconductor device further includes a plurality of second vertical channel structures formed through the second stacked structure, wherein the plurality of second vertical channel structures are respectively connected to the plurality of first vertical channel structures. The semiconductor device additionally includes an isolating layer for isolating the plurality of second vertical channel structures into first and second regions. Both sidewalls of the isolating layer contact sidewalls of the second vertical channel structures of the plurality of second vertical channel structures positioned at the boundary between the first and second regions.

Further in accordance with an embodiment, a semiconductor device includes a stacked structure including gate electrodes and dielectric layers alternately stacked over a substrate, the stacked structure having a first edge sidewall extending in a first direction parallel to the substrate. The semiconductor device further includes a plurality of first edge vertical channel structures formed through the first edge sidewall of the stacked structure in a second direction perpendicular to the substrate, wherein sidewalls of the plurality of first edge vertical channel structures are partially surrounded by the first edge sidewall.

DETAILED DESCRIPTION

Figure 1A:
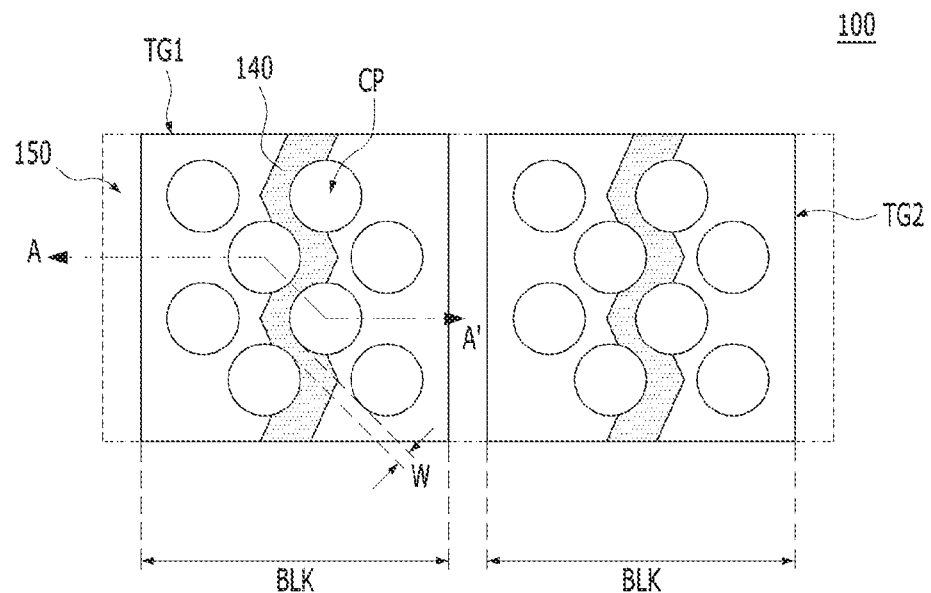
FIG. 1A shows a plan view illustrating a semiconductor device in accordance with an embodiment.

Various embodiments disclosed in this specification are described with reference to cross-sectional views, plan views, and block diagrams, which are ideal schematic views of the present disclosure. Thus, the drawings may be modified due to variations in fabrication technique and/or permissible errors. Therefore, the embodiments are not limited to the specific shapes illustrated in the drawings, but may include changes in shape, which occur depending on a fabrication process. Thus, regions illustrated in the drawings have schematic properties, and the shapes of the regions exemplify specific shapes of the regions, and do not limit the scope of the present disclosure.

Figure 1B:
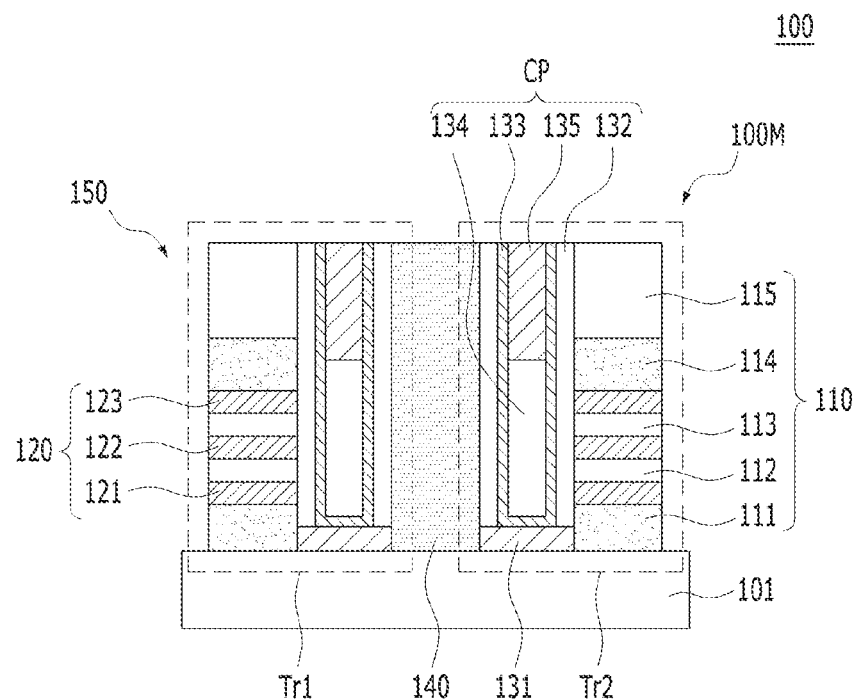
FIG. 1B shows a cross-sectional view taken along the line A-A' of FIG. 1A.
Figure 1C:
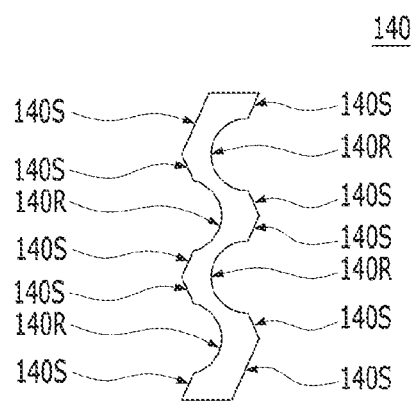
FIG. 1C shows a detailed view of an isolating layer.

FIG. 1A shows a plan view illustrating a semiconductor device 100, in accordance with an embodiment. FIG. 1B shows a cross-sectional view taken along a line A-A' in FIG. 1A. FIG. 1C shows a detailed view of an isolating layer.

Referring to FIGS. 1A to 1C, the semiconductor device 100 may include a plurality of vertical transistors Tr1 and Tr2. The semiconductor device 100 may include the plurality of vertical transistors Tr1 and Tr2 which are vertically formed over a substrate 101.

Each of the vertical transistors Tr1 and Tr2 may include one vertical channel structure CP. The vertical channel structure CP and the substrate 101 may be connected through a first pad 131. The vertical channel structure CP may include a gate dielectric layer 132, a channel layer 133, a core dielectric layer 134, and a second pad 135. The first pad 131, the second pad 135, and the channel layer 133 may include a conductive material. The first pad 131, the second pad 135, and the channel layer 133 may include a silicon layer. The first pad 131, the second pad 135, and the channel layer 133 may include a silicon layer doped with a conductive impurity.

The vertical channel structure CP may be formed through an alternating stack 100M so as to contact the substrate 101. The alternating stack 100M may include a dielectric layer stack 110 and a gate electrode stack 120. The dielectric layer stack 110 may include first and second buffer layers 111 and 114. Between the first and second buffer layers 111 and 114, dielectric layers 112 and 113 may be formed. A capping layer 115 may be formed on the second buffer layer 114. The first and second buffer layers 111 and 114, the dielectric layers 112 and 113, and the capping layer 115 may include the same material. The first and second buffer layers 111 and 114, the dielectric layers 112 and 113, and the capping layer 115 may include silicon oxide.

The gate electrode stack 120 may include a plurality of gate electrodes 121, 122, and 123. The plurality of dielectric layers 112 and 113 may be formed between the respective gate electrodes 121, 122, and 123.

The neighboring vertical transistors Tr1 and Tr2 may be isolated from each other by an isolating layer 140. The isolating layer 140 may include a dielectric material, for example, silicon oxide.

Vertical transistor groups TG1 and TG2 may be divided on a block basis by a slit 150. For example, one block BLK may include the vertical transistor group TG1, and the vertical transistor group TG1 may include the plurality of vertical transistors Tr1 and Tr2.

Referring to FIG. 1C, the isolating layer 140 may include a plurality of linear shape sidewalls 140S and a plurality of round shape sidewalls 140R. The plurality of round shape sidewalls 140R may surround the sidewalls of the vertical channel structures CP.

In accordance with the above-described structure, the isolating layer 140 may be formed in a zigzag shape or wave shape. Because the isolating layer 140 does not occupy a separate space, an isolating space W between the neighboring vertical transistors Tr1 and Tr2 can be minimized. Therefore, because the size of the block BLK can be reduced, it is possible to improve the degree of integration of the semiconductor device 100.

Figure 1D:
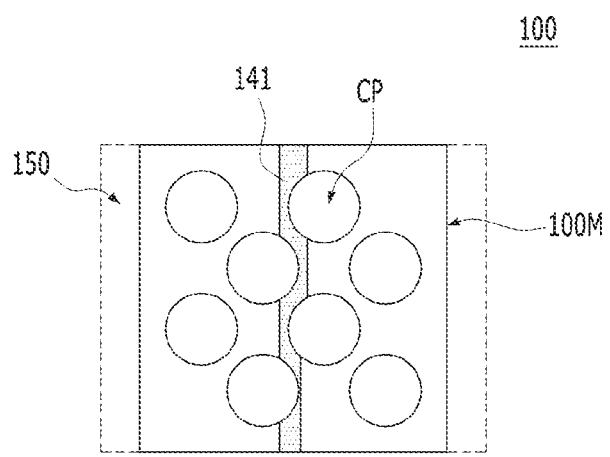
FIG. 1D shows a plan view illustrating a semiconductor device in accordance with a modification of FIG. 1A.

FIG. 1D is a plan view illustrating the semiconductor device 100 in accordance with a modification of the embodiment shown in FIG. 1A. The modification includes an isolating layer 141 having a linear line shape rather than the zigzag shape of the isolating layer 140.

The above-described semiconductor device 100 may be a part of a vertical memory device. The semiconductor device 100 may be part of a vertical NAND. For example, the semiconductor device 100 may serve as a select transistor of the vertical NAND. The select transistor of the vertical NAND may include a source select transistor and a drain select transistor.

FIGS. 2A to 3M show diagrams for describing a method of fabricating a semiconductor device in accordance with an embodiment. FIGS. 2A to 2M show plan views for describing the method, and FIGS. 3A to 3M show cross-sectional views taken along the line A-A' of FIGS. 2A to 2M.

Figure 2A:
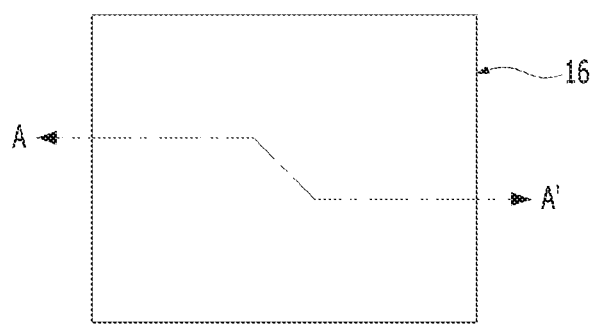
FIGS. 2A to 2M show plan views for describing a method for fabricating a semiconductor device in accordance with an embodiment.
Figure 3A:
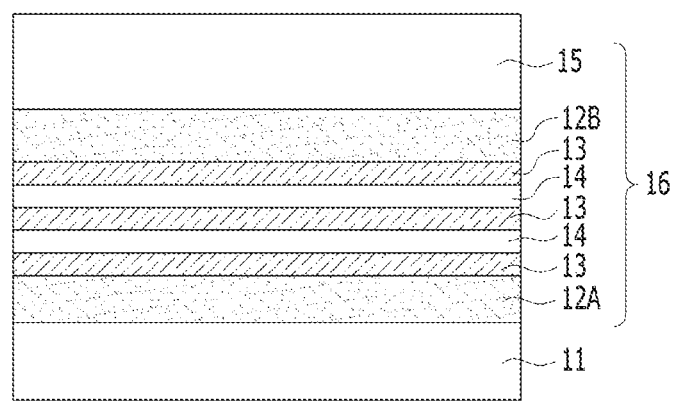
FIGS. 3A to 3M show cross-sectional views taken along the A-A' lines of FIGS. 2A to 2M.

As illustrated in FIGS. 2A and 3A, an alternating stack 16 may be formed on a substrate 11. The alternating stack 16 may include first and second material layers, which are sequentially formed. The first material layer may include a first material, and the second material layer may include a second material. The first and second materials may be formed of different materials from each other. The first and second materials may include dielectric layers 12A, 12B, and 14 and sacrificial layers 13, respectively. The dielectric layers 12A, 12B, and 14 may include a dielectric material, and the sacrificial layers 13 may include a sacrificial material. Here, 'sacrificial material' may indicate a material that is removed in a subsequent process. The dielectric layers 12A, 12B, and 14 may include one or more dielectric materials, such as silicon oxide, silicon nitride, silicon oxynitride, spin-on dielectric material, dielectric metal oxide, silicate, and dielectric metal oxynitride.

The sacrificial layers 13 may include a sacrificial material which can be removed selectively with respect to the dielectric layers 12A, 12B, or 14. The removal process of the sacrificial layers 13 may be performed selectively with respect to the dielectric layers 12A, 12B, or 14. The ratio of the removal rate of the sacrificial layers 13 to the removal rate of the dielectric layers 12A, 12B, or 14 may be referred to as the selectivity of the removal process of the sacrificial layers 13 with respect to the dielectric layers 12A, 12B, or 14.

The sacrificial layers 13 may include a dielectric material. The sacrificial layers 13 may be replaced with a conductive material after removal during a subsequent process. For example, the sacrificial layers 13 may be replaced with a control gate electrode of a vertical NAND device. The sacrificial layers 13 may include silicon nitride, amorphous silicon, or polysilicon. In some embodiments, the sacrificial layers 13 may include silicon nitride.

In an embodiment, the dielectric layers 12A, 12B, and 14 may include silicon oxide, and the sacrificial layers 13 may include silicon nitride.

The dielectric layers 12A, 12B, and 14 may be deposited by chemical vapor deposition (CVD) or atomic layer deposition (ALD). The sacrificial layers 13 may be deposited by CVD or ALD.

The dielectric layers 12A, 12B, and 14 may include a first buffer layer 12A, a dielectric material layers 14, and a second buffer layer 12B. The first and second buffer layers 12A and 12B may be thicker than the dielectric material layers 14. The first buffer layer 12A may contact the substrate 11, and the second buffer layer 12B may contact the uppermost sacrificial layer 13. The first and second buffer layers 12A and 12B and the dielectric material layers 14 may be formed of the same material.

The dielectric material layers 14 and the sacrificial layers 13 may have the same thickness. The first and second buffer layers 12A and 12B may have a greater thickness than the sacrificial layers 13.

The plurality of sacrificial layers 13 and the plurality of dielectric material layers 14 may be alternately stacked. In the pictured embodiment, three sacrificial layers 13 are alternately stacked with two dielectric material layers 14. In different embodiments, different numbers of sacrificial layers 13 and dielectric material layers 14 may be alternately stacked. For example, the number of the sacrificial layers 13 and the number of dielectric material layers 14, which are alternately stacked, may range from 8 to 1024. The number of the sacrificial layers 13 and the number of dielectric material layers 14, which are alternately stacked, may be equal to or more than 1024.

A capping layer 15 may be formed on the second buffer layer 12B. The capping layer 15 may include a dielectric material. The capping layer 15 may be formed of the same material as the first and second buffer layers 12A and 12B and the dielectric material layers 14.

Figure 2B:
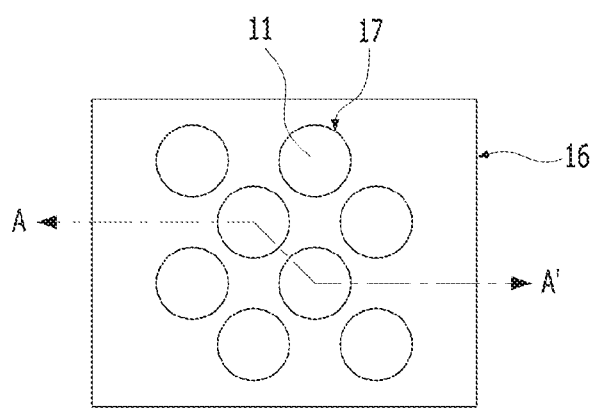
Figure 3B:
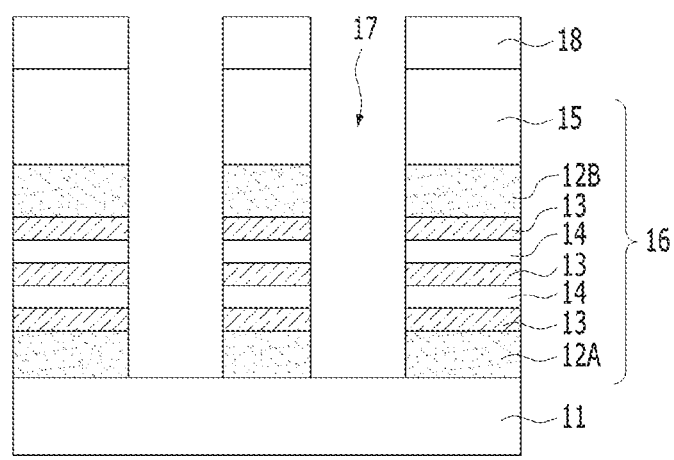

As illustrated in FIGS. 2B and 3B, an opening 17 may be formed. The opening 17 may be formed in the alternating stack 16. To form the opening 17, the alternating stack 16 may be partially etched through a first mask 18. The first mask 18 may include a photoresist pattern. The bottom of the opening 17 may expose the top surface of the substrate 11. The opening 17 may be a vertical hole. A plurality of openings 17 may be arrayed. The openings 17 may be arrayed in a zigzag shape. The openings 17 may have a uniform size.

Figure 2C:
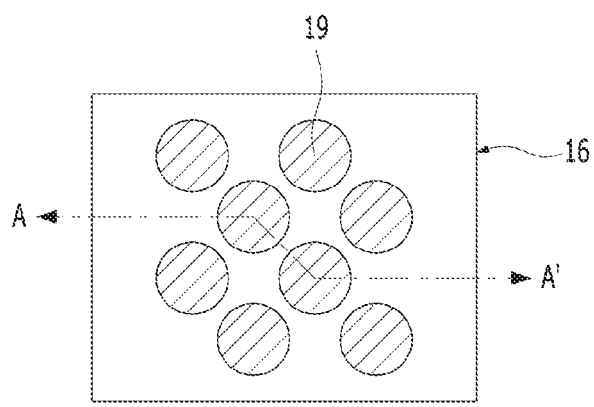
Figure 3C:
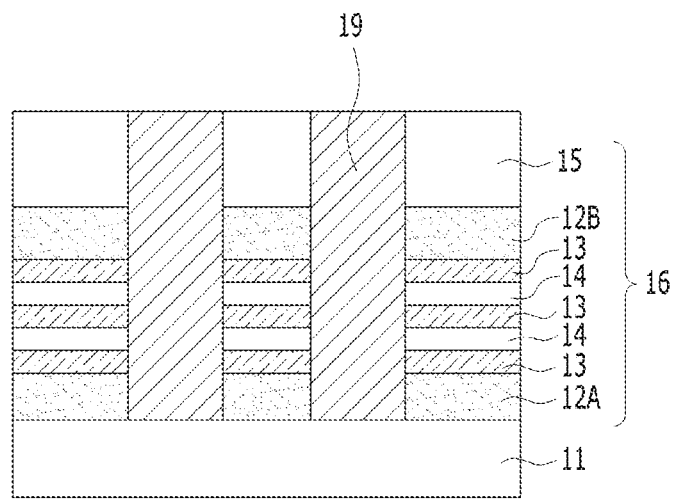

As illustrated in FIGS. 2C and 3C, a first pad material 19 may be formed in the opening 17. Before the first pad material 19 is formed, the first mask 18 may be removed. The first pad material 19 may completely fill the inside of the opening 17. The top surface of the first pad material 19 may have the same level as the top surface of the capping layer 15. The first pad material 19 may include a silicon-containing material. The first pad material 19 may include a conductive material. The first pad material 19 may include a silicon layer. The first pad material 19 may include a polysilicon layer. For example, a polysilicon layer may be deposited on the entire surface of the substrate 11 so as to fill the opening 17, and may then planarized until the top surface of the capping layer 15 is exposed. Thus, the first pad material 19 may be formed, which includes the pillar-shape polysilicon layer to fill the opening 17.

Figure 2D:
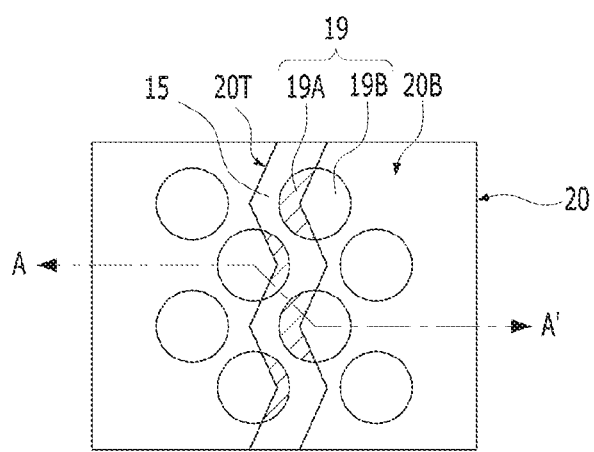
Figure 3D:
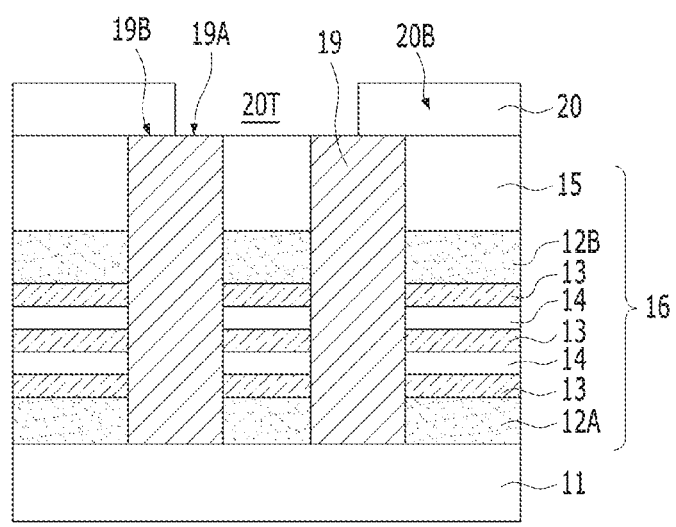

As illustrated in FIGS. 2D and 3D, a second mask 20 may be formed. The second mask 20 may include a photoresist pattern. The second mask 20 may include an opening 20T and a blocking portion 20B. When seen from the top, the opening 20T of the second mask 20 may have a line shape. The opening 20T may have a linear line shape or wave line shape. Through the opening 20T of the second mask 20, a portion of the first pad material 19 may be exposed. The blocking portion 20B of the second mask 20 may cover the other portion of the first pad material 19. When any one first pad material 19 is considered, a portion 19A of the top surface of the first pad material 19 may be exposed through the opening 20T of the second mask 20, and the other portion 19B of the top surface of the first pad material 19 may be covered by the blocking portion 20B of the second mask 20.

Figure 2E:
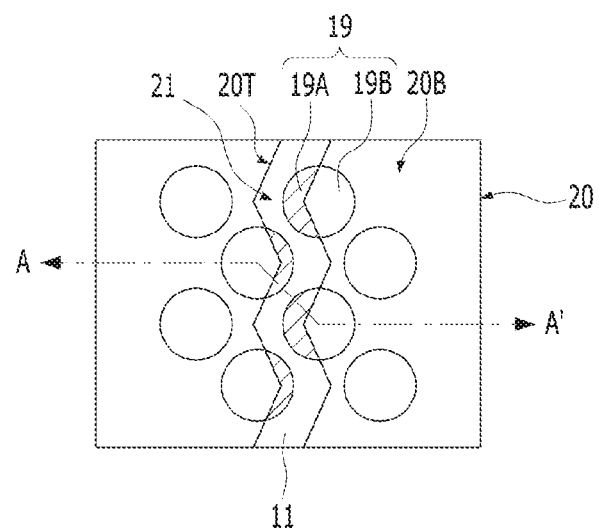
Figure 3E:
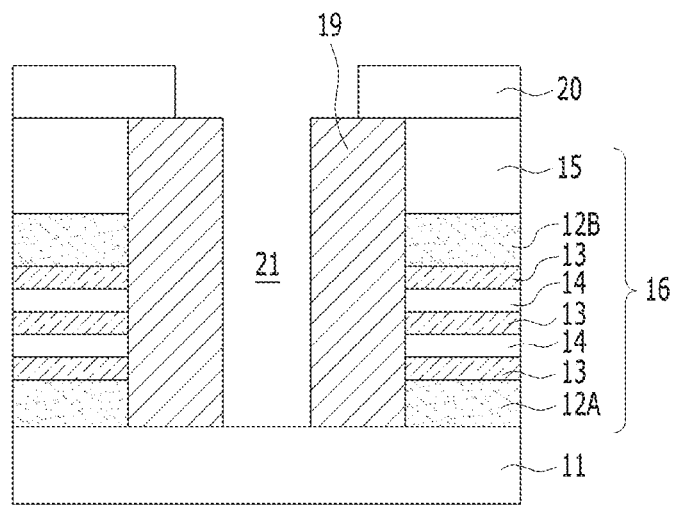

As illustrated in FIGS. 2E and 3E, an isolating trench 21 may be formed. In order to form the isolating trench 21, the alternating stack 16 may be partially etched through the second mask 20 serving as an etch barrier. When the alternating stack 16 is etched, the first pad material 19 may be used as an etch barrier. Therefore, the isolating trench 21 may be self-aligned with the first pad material 19. The isolating trench 21 may be formed between the neighboring first pad materials 19.

When seen from the top, the isolating trench 21 may have a line shape. The isolating trench 21 may have a linear line shape or wave line shape. The sidewall of the first pad material 19 may be partially exposed by the isolating trench 21. The sidewalls of the plurality of first pad materials 19 may be partially exposed by one isolating trench 21. In the illustrated embodiment, the isolating trench 21 may partially expose the sidewalls of four neighboring first pad materials 19. The bottom of the isolating trench 21 may expose a portion of the substrate 11.

During the process of etching the alternating stack 16 to form the isolating trench 21 as described above, the first pad material 19 may be used as an etch stop layer. Therefore, the alternating stack 16 may be etched in such a manner that the isolating trench 21 is self-aligned with the sidewall of the first pad material 19.

Figure 2F:
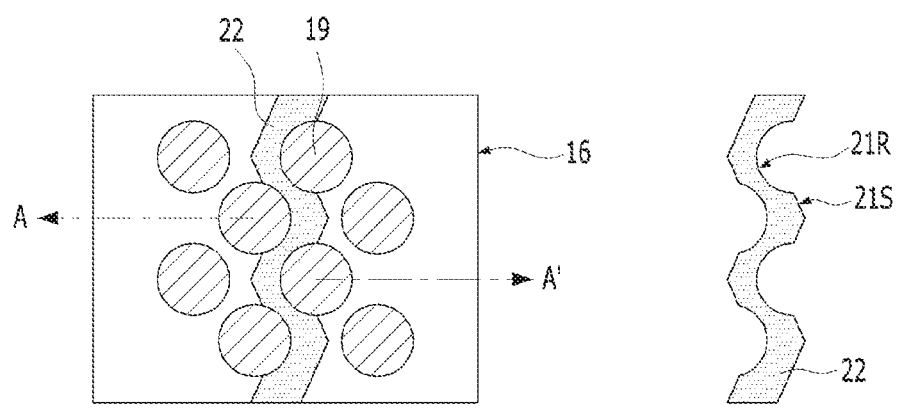
Figure 3F:
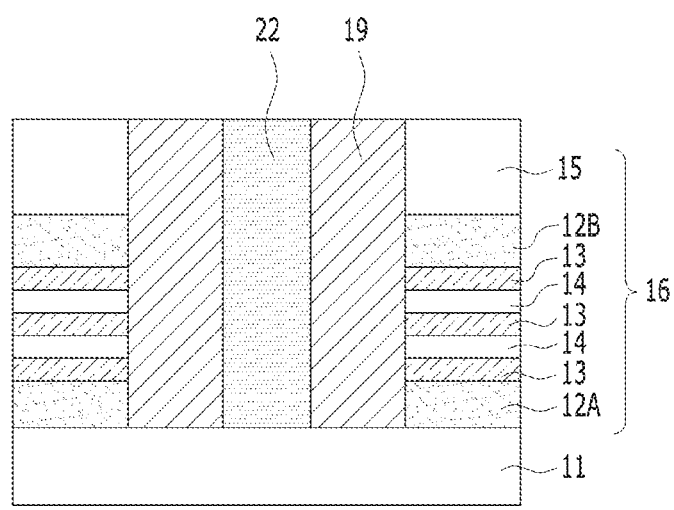

As illustrated in FIGS. 2F and 3F, the second mask 20 may be removed. An isolating layer 22 may be formed in the isolating trench 21. The isolating layer 22 may include a dielectric material. The isolating layer 22 may be formed of the same material as the first and second buffer layers 12A and 12B and the dielectric material layers 14. The isolating layer 22 and the sacrificial layers 13 may be formed of different materials. The isolating layer 22 and the first pad material 19 may be formed of different materials. The isolating layer 22 may include silicon oxide. In order to form the isolating layer 22, silicon oxide may be deposited on the entire surface of the substrate 11 so as to fill the isolating trench 21, and may then be planarized. The isolating layer 22 may be formed in the isolating trench 21, and might not be formed on the top surfaces of the capping layer 15 and the first pad material 19. The top surface of the isolating layer 22, the top surface of the capping layer 15, and the top surface of the first pad material 19 may have the same level.

When seen from the top, the isolating layer 22 may have a line shape. The isolating layer 22 may have a linear line shape or wave line shape. The isolating layer 22 may directly contact the sidewalls of the plurality of first pad materials 19. The isolating layer 22 may include a plurality of linear shape sidewalls 21S and a plurality of round shape sidewalls 21R. The plurality of linear shape sidewalls 21S may contact the alternating stack 16, and the plurality of round shape sidewalls 21R may contact the plurality of first pad materials 19.

Figure 2G:
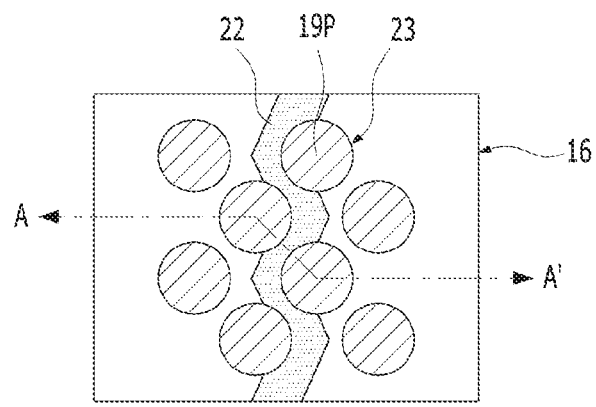
Figure 3G:
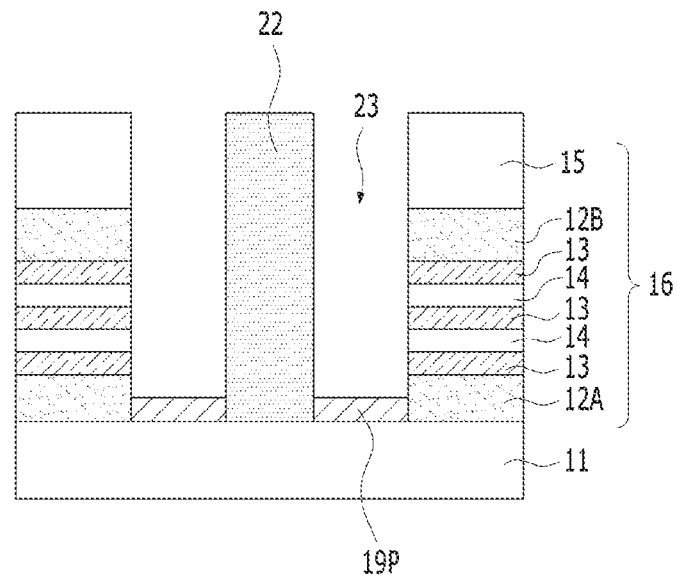

As illustrated in FIGS. 2G and 3G, a part of the first pad material 19 may be recessed. Thus, a first pad 19P may be formed, and a recess 23 may be formed over the first pad 19P. The first pad 19P may contact the substrate 11. The first pad 19P may have less thickness than the first buffer layer 12A. The top surface of the first pad 19P may be at lower level than the top surface of the first buffer layer 12A. In order to form the first pad 19P, the first pad material 19 may be wet-etched. When the first pad material 19 is wet-etched, the isolating layer 22, the alternating stack 16, and the capping layer 15 might not be etched.

When seen from the top, the recess 23 may have a circular shape. Neighboring recesses 23 may be isolated by the isolating layer 22.

Figure 2H:
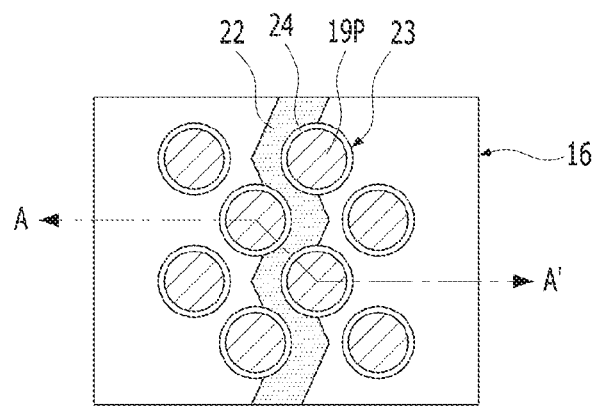
Figure 3H:
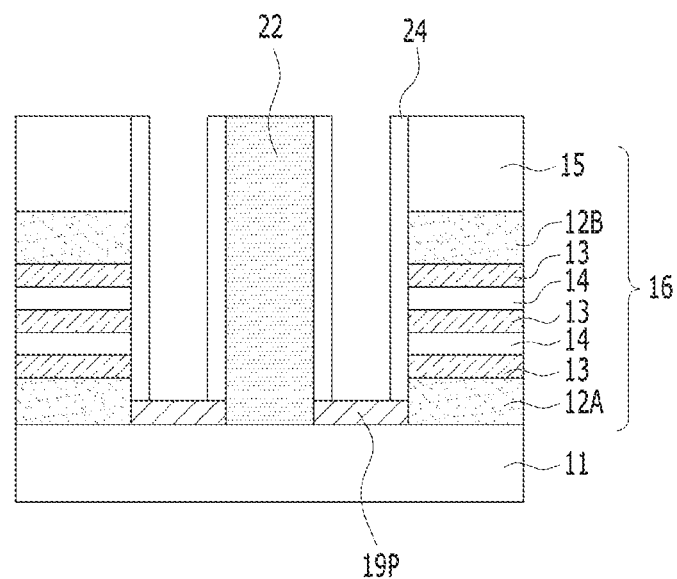

As illustrated in FIGS. 2H and 3H, a memory layer 24 may be formed in the recess 23. The memory layer 24 may include a tunnel dielectric layer, a charge storage layer, and a blocking layer. The memory layer 24 may include a stack of oxide and nitride. The memory layer 24 may include an oxide/nitride/oxide (ONO) stack (e.g., an $SiO_2$—$Si_3N_4$—$SiO_2$ stack). The memory layer 24 may have a spacer shape. The memory layer 24 may be formed on the sidewall of the recess 23. The bottom of the memory layer 24 may contact the top surface of the first pad 19P. The top surface of the first pad 19P may be partially exposed by the memory layer 24. The top surface of the memory layer 24 may have the same level as the top surface of the capping layer 15 and the top surface of the isolating layer 22. When seen from the top, the memory layer 24 may have a ring shape that surrounds the sidewall of the recess 23. Although the memory layer 24 is formed, the inside of the recess 23 may remain as an empty space.

Figure 2I:
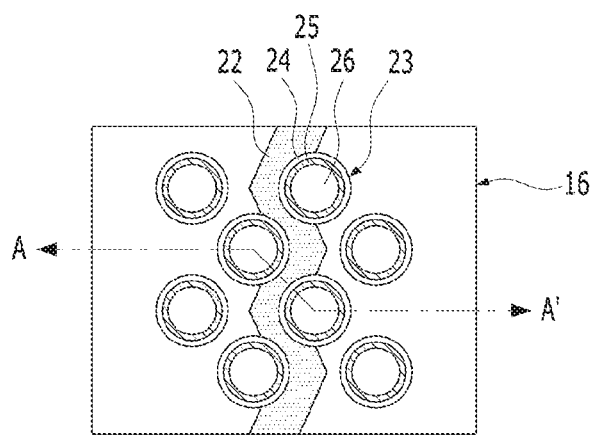
Figure 3I:
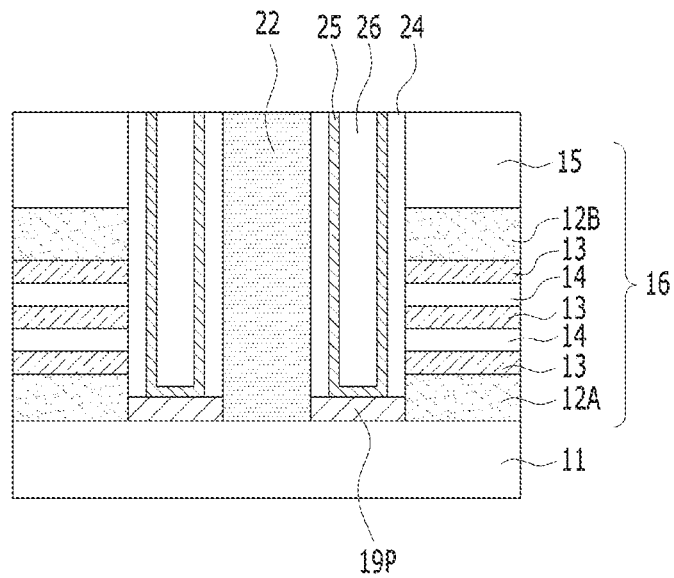

As illustrated in FIGS. 2I and 3I, a channel layer 25 may be formed. A core dielectric layer 26 may be formed on the channel layer 25 so as to completely fill the recess 23. The channel layer 25 may include a silicon layer. The channel layer 25 may include a doped silicon layer. The core dielectric layer 26 may include silicon oxide. The bottom of the channel layer 25 may contact the first pad 19P. In order to form the channel layer 25 and the core dielectric layer 26, a silicon layer and a silicon oxide layer may be sequentially formed and then planarized.

The channel layer 25 may have a cylindrical shape, and the core dielectric layer 26 may have a pillar shape to fill the cylinder-shaped inside of the channel layer 25.

Figure 2J:
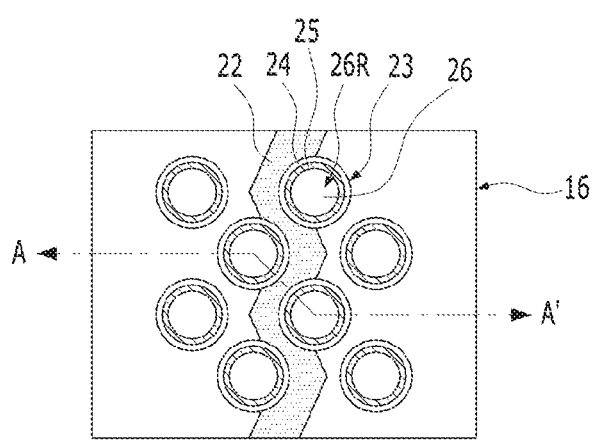
Figure 3J:
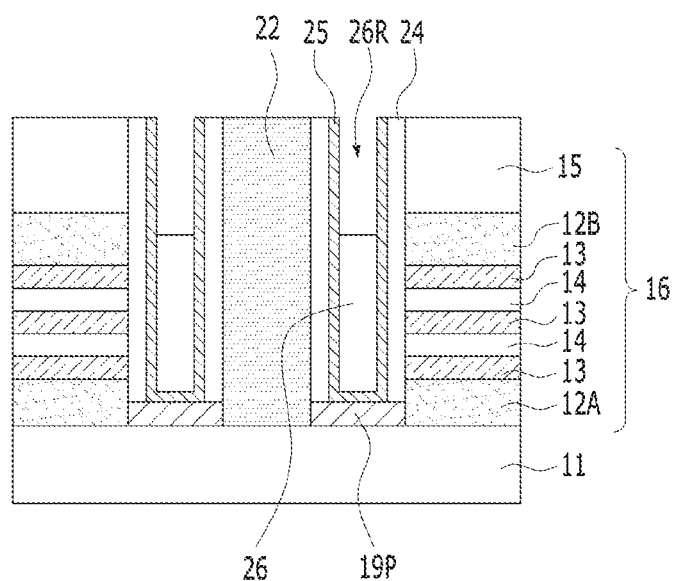

As illustrated in FIGS. 2J and 3J, the top of the core dielectric layer 26 may be recessed to a predetermined depth. The top surface of the recessed core dielectric layer 26 may have a lower level than the top surfaces of the capping layer 15 and the isolating layer 22. The top surface of the recessed core dielectric layer 26 may have a higher level than the bottom surface of the second buffer layer 12B. The top surface of the core dielectric layer 26 may have a lower level than the top surfaces of the channel layer 25 and the memory layer 24.

A recess 26R may be formed over the core dielectric layer 26.

Figure 2K:
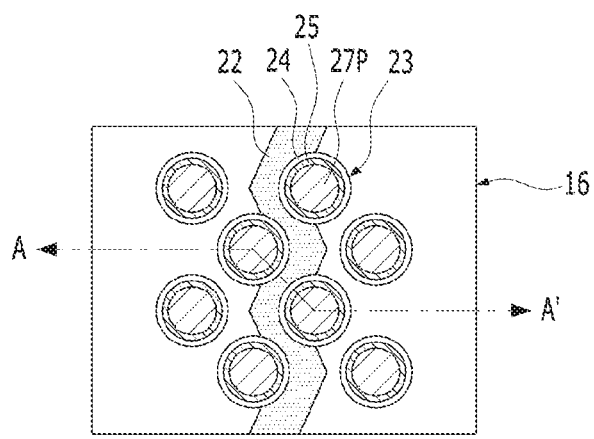
Figure 3K:
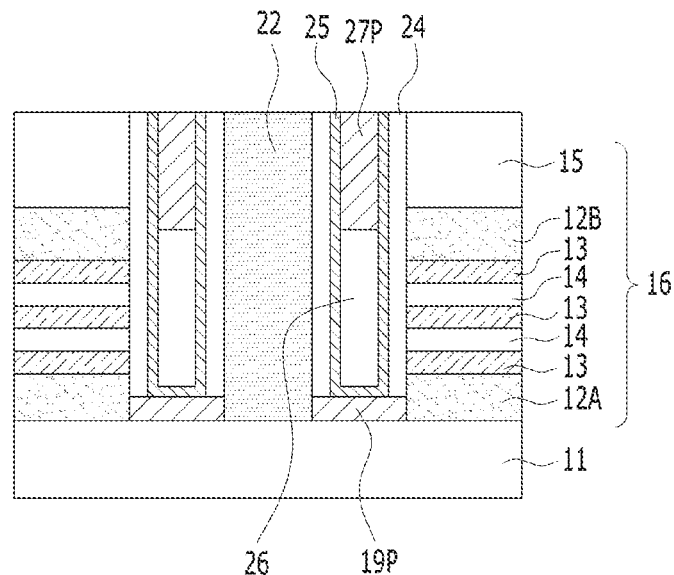

As illustrated in FIGS. 2K and 3K, a second pad 27P may be formed. The second pad 27P may fill the recess 26R over the core dielectric layer 26. The second pad 27P and the first pad 19P may include the same material. The second pad 27P may include a polysilicon layer. In order to form the second pad 27P, a polysilicon layer may be deposited to fill the recess 26R, and may then be planarized.

The top surface of the second pad 27P may have the same level as the top surfaces of the isolating layer 22 and the capping layer 15.

The first pad 19P, the core dielectric layer 26, the channel layer 25, the memory layer 24, and the second pad 27P may be collectively referred to as a vertical pillar structure. Because the vertical pillar structure is formed after the isolating layer 22 is formed, loss of the channel layer 25 can be prevented.

Figure 2L:
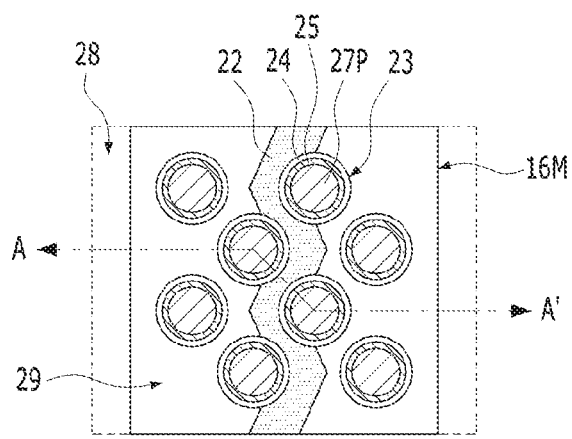
Figure 3L:
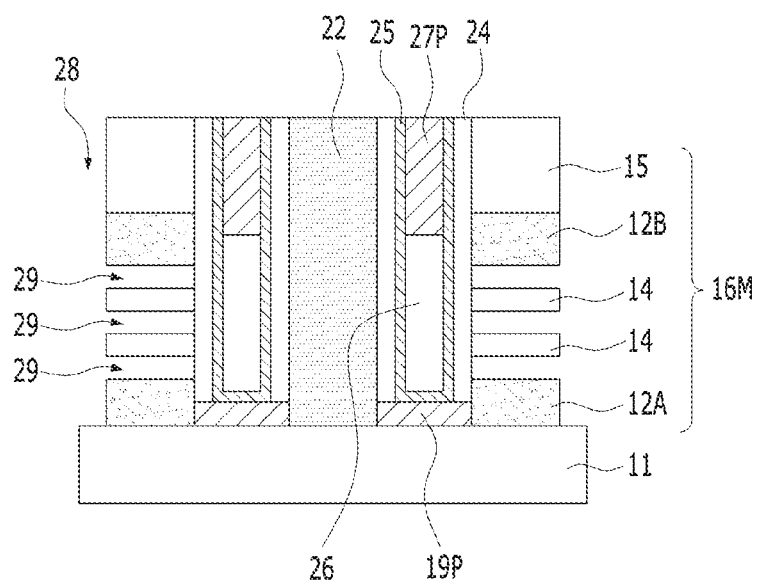

As illustrated in FIGS. 2L and 3L, a slit 28 may be formed. In order to form the slit 28, the alternating stack 16 may be partially etched.

Then, a plurality of lateral recesses 29 may be formed. In order to form the lateral recesses 29, the sacrificial layers 13 of the alternating stack 16 may be selectively removed through the slit 28. The plurality of lateral recesses 29 may be positioned between the first and second buffer layers 12A and 12B. Between the respective lateral recesses 29, the dielectric material layers 14 may be positioned.

The alternating stack in which the plurality of lateral recesses 29 are formed may remain as indicated by reference numeral '16M.'

Figure 2M:
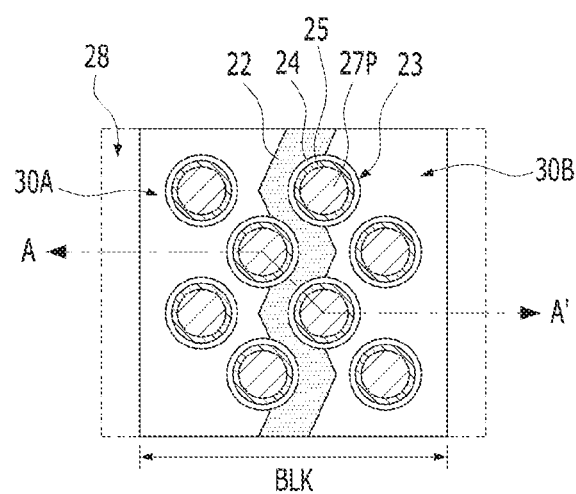
Figure 3M:
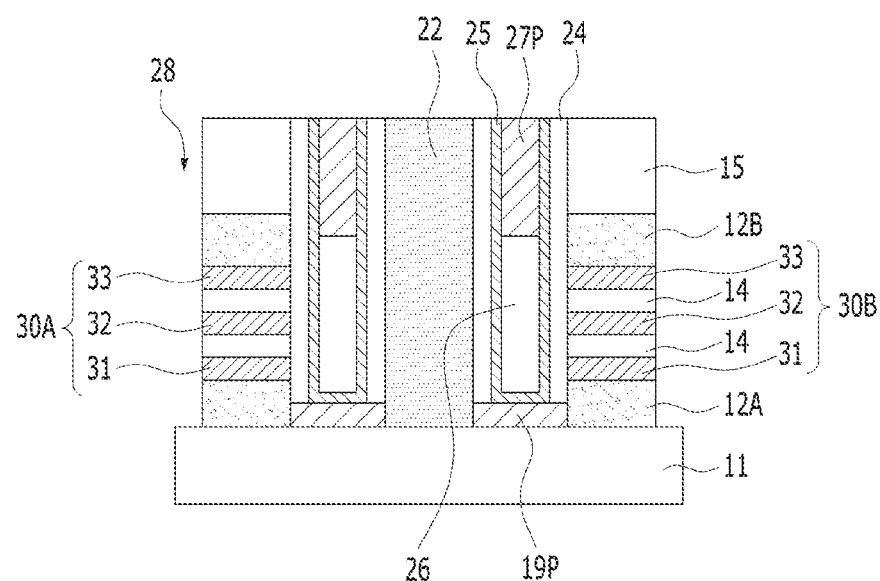

As illustrated in FIGS. 2M and 3M, gate electrode stacks 30A and 30B may be formed in the lateral recesses 29. Each of the gate electrode stacks 30A and 30B may include a plurality of gate electrodes 31, 32, and 33. The gate electrodes 31, 32, and 33 may be formed in the plurality of lateral recesses 29, respectively. The plurality of gate electrodes 31, 32, and 33 may be positioned between the first and second buffer layers 12A and 12B. Between the respective gate electrodes 31, 32, and 33, the dielectric material layers 14 may be positioned.

The gate electrode stacks 30A and 30B may have a shape that surrounds the sidewall of the vertical pillar structure. A portion of the vertical pillar structure, which contacts the isolating layer 22, may be surrounded by the gate electrode stacks 30A and 30B. Neighboring gate electrode stacks 30A and 30B may be isolated from each other by the isolating layer 22. One block BLK may include the gate electrode stacks 30A and 30B and the isolating layer 22. Because the isolating layer 22 does not occupy a separate space, the size of the block BLK can be reduced.

The gate electrodes 31, 32, and 33 may include a low resistivity material. The gate electrodes 31, 32, and 33 may include a metal-base material. The gate electrodes 31, 32, and 33 may include a metal, metal silicide, metal nitride, or combinations thereof. For example, the metal may include nickel, cobalt, platinum, titanium, tantalum, or tungsten, and the metal silicide may include nickel silicide, cobalt silicide, platinum silicide, titanium silicide, tantalum silicide, or tungsten silicide. The gate electrodes 31, 32, and 33 may further include a barrier material (not illustrated). The barrier material may include metal nitride. For example, the barrier material may include titanium nitride (TiN).

In an embodiment, the gate electrodes 31, 32, and 33 may include a tungsten layer. The tungsten layer may be deposited through a process using $WF_6$ as a tungsten source material and using one or more of $H_2$, $SiH_4$, and $B_2H_6$ as a reducing gas. In another embodiment, the tungsten layer may be deposited through a process using a fluorine-free tungsten source material, such as $W(CO)_6$.

Figure 4A:
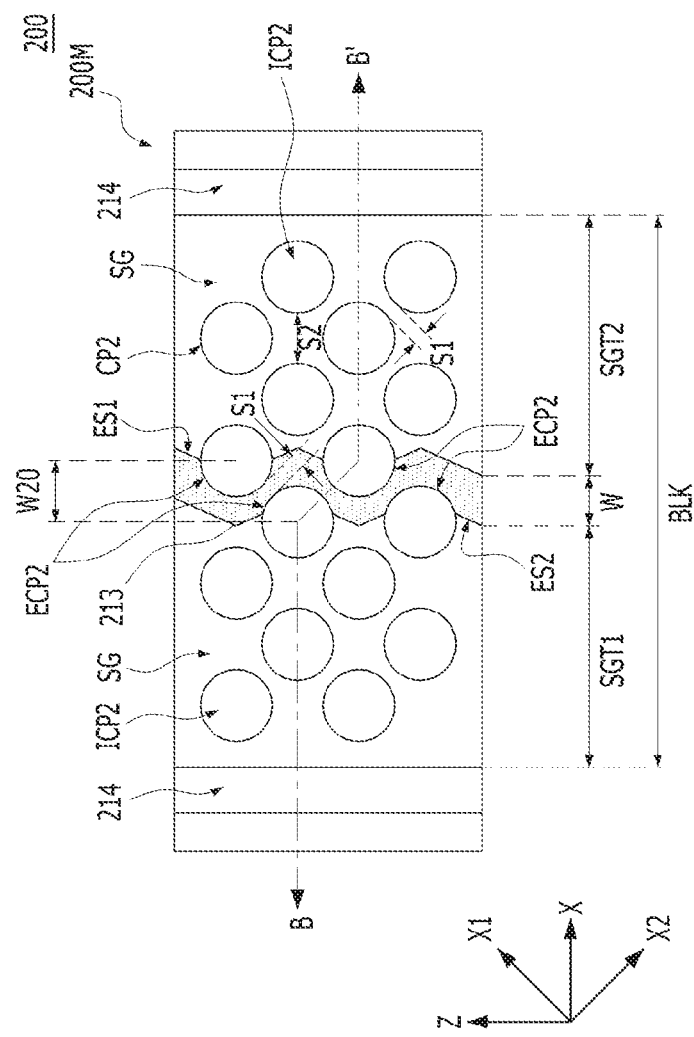
FIG. 4A illustrates a vertical NAND.
Figure 4B:
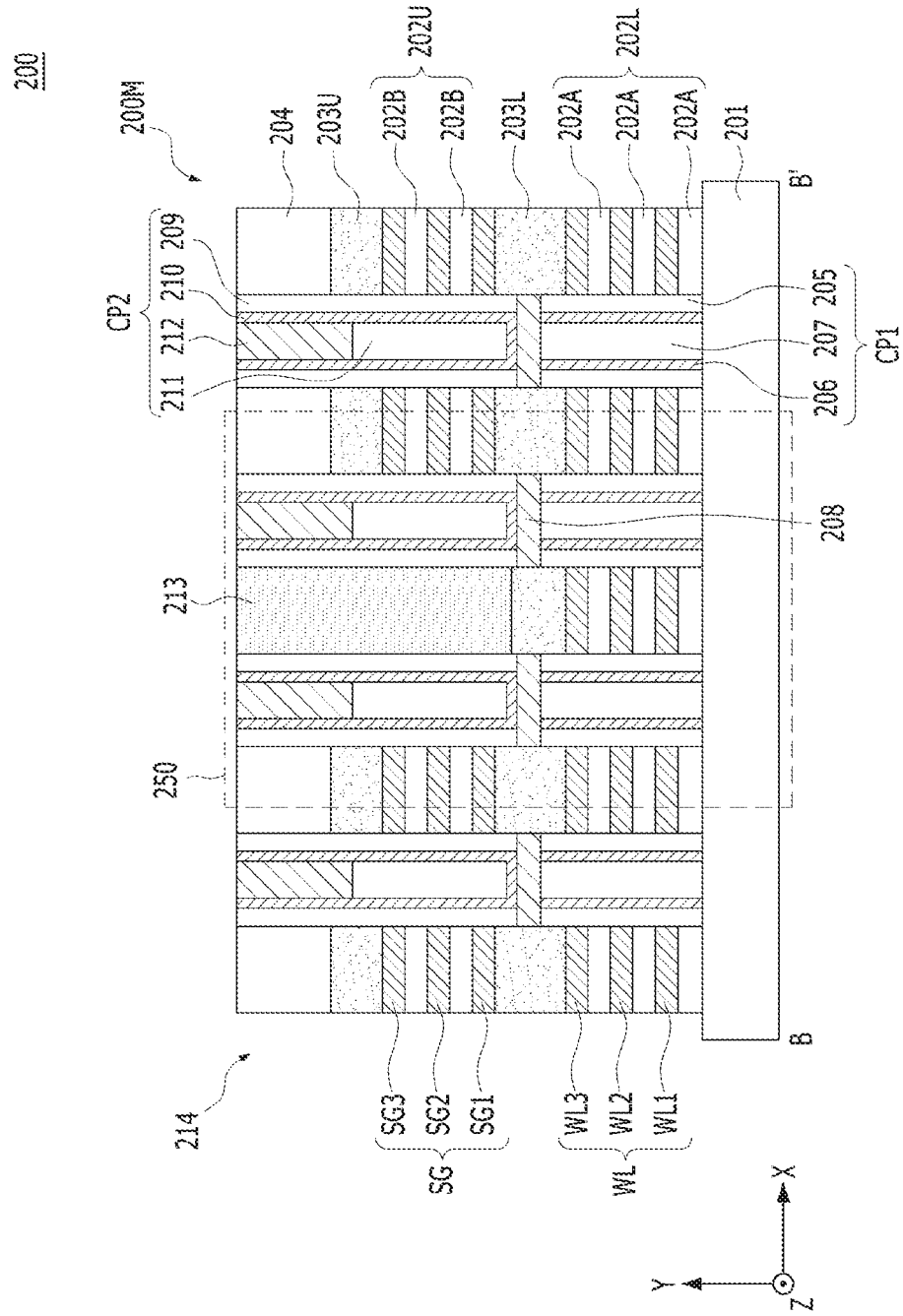
FIG. 4B shows a cross-sectional view taken along the line A-A' of FIG. 4A.
Figure 4C:
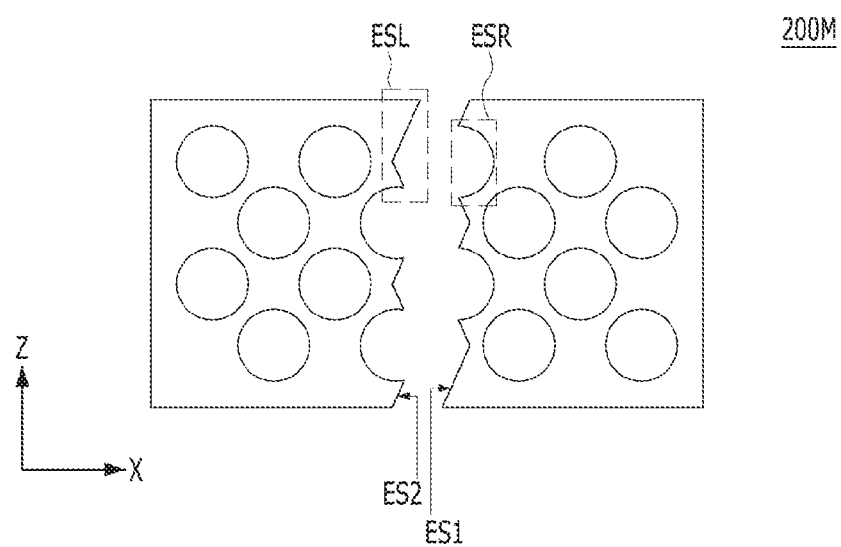
FIG. 4C shows a diagram for describing edge sidewalls of a stacked structure.
Figure 4D:
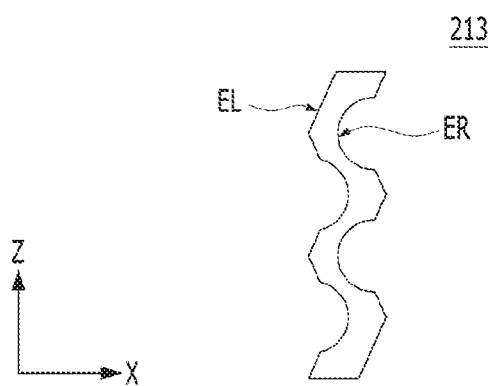
FIG. 4D shows a diagram for describing edge sidewalls of an isolating layer.

FIG. 4A illustrates a vertical NAND. FIG. 4B shows a cross-sectional view taken along a line B-B' of FIG. 4A. FIG. 4C shows a diagram for describing edge sidewalls of a stacked structure. FIG. 4D shows a diagram for describing edge sidewalls of an isolating layer. FIGS. 4A and 4B illustrate one block BLK.

Referring to FIGS. 4A to 4D, the vertical NAND 200 may include a stacked structure 200M formed over a bottom structure 201. The stacked structure 200M may include a plurality of conductive layers and a plurality of dielectric layers, which are alternately stacked. The stacked structure 200M may include a first edge sidewall ES1 and a second edge sidewall ES2. The first and second edge sidewalls ES1 and ES2 may extend in a first direction (Z direction) parallel to the bottom structure 201. The stacked structure 200M may include a plurality of edge vertical channel structures ECP2. The plurality of edge vertical channel structures ECP2 may be formed through the first and second edge sidewalls ES1 and ES2 of the stacked structure 200M. The plurality of edge vertical channel structures ECP2 may be formed through the first and second edge sidewalls ES1 and ES2 in a second direction (Y direction) perpendicular to the bottom structure 201. The sidewalls of the plurality of edge vertical channel structures ECP2 may be partially surrounded by the first and second edge sidewalls ES1 and ES2.

The first and second edge sidewalls ES1 and ES2 may include a plurality of linear shape sidewalls ESL and a plurality of round shape sidewalls ESR, which are continuous in the first direction (Z direction). The round shape sidewalls ESR of the first and second edge sidewalls ES1 and ES2 may contact the sidewalls of the respective edge vertical channel structures ESP2. The round shape sidewalls ESR and the linear shape sidewalls ESL of the first and second edge sidewalls ES1 and ES2 may be vertically extended in the second direction (Y direction).

The stacked structure 200M may further include internal vertical channel structures ICP2 which are spaced apart from the edge vertical channel structures ECP2 and formed through the stacked structure 200M. The internal vertical channel structures ICP2 may be arrayed while being spaced apart from each other in a third direction (X direction) which is parallel to the bottom structure 201 and crosses the first direction (Z direction). The sidewalls of the internal vertical channel structures ICP2 may be completely surrounded by the stacked structure 200M.

The first and second edge sidewalls ES1 and ES2 may be spaced apart from each other, with the isolating layer 213 provided therebetween. The plurality of edge vertical channel structures ECP2 arrayed in the first direction (Z direction) may be arrayed in a zigzag shape. The plurality of edge vertical channel structures ECP2 may be spaced apart from each other with the isolating layer 213 provided therebetween. The plurality of edge vertical channel structures ECP2 contacting the round shape sidewalls ESR of the first edge sidewall ES1 and the plurality of edge vertical channel structures ECP2 contacting the round shape sidewalls ESR of the second edge sidewall ES2 may be spaced apart from each other by a distance S1, with the isolating layer 213 provided therebetween. The distance S1 may indicate a space between the edge vertical channel structures ECP2 based on fourth and fifth directions (X1 direction and X2 direction). The fourth direction (X1 direction) and the fifth direction (X2 direction) may cross the first direction (Z direction) and the third direction (X direction). The distance S1 between the edge vertical channel structures ECP2 may be smaller than a distance S2 between the internal vertical channel structures ICP2 which are spaced apart from each other in the third direction (X direction). For various embodiments, the edge vertical channel structures ECP2 and the internal vertical channel structures ICP2 are arrayed uniformly with repeated intervals.

The isolating layer 213 may include sidewalls to which the first and second edge sidewalls ES1 and ES2 are respectively transferred. Therefore, the isolating layer 213 may include a plurality of round shape sidewalls ER and a plurality of linear shape sidewalls EL. The plurality of round shape sidewalls ER of the isolating layer 213 may contact the round shape sidewalls ESR of the first and second edge sidewalls ES1 and ES2. The plurality of linear shape sidewalls EL of the isolating layer 213 may contact the linear shape sidewalls ESL of the first and second edge sidewalls ES1 and ES2. The round shape sidewalls ER of the isolating layer 213 may directly contact the edge vertical channel structures ECP2.

The round shape sidewalls ESR of the first and second edge sidewalls ES1 and ES2 may partially surround the sidewalls of the edge vertical channel structures ESP2. The round shape sidewalls ER of the isolating layer 213 may partially surround the edge vertical channel structures ECP2.

The stacked structure 200M may include a word line stack WL and a select gate stack SG. The select gate stack SG may be positioned over the word line stack WL. The vertical NAND 200 may further include a plurality of first vertical channel structures CP1 formed through the word line stack WL and a plurality of second vertical channel structures CP2 formed through the select gate stack SG. The vertical NAND 200 may further include a first dielectric layer stack 202L, a second dielectric layer stack 202U, a first buffer layer 203L, a second buffer layer 203U, and a capping layer 204.

The first dielectric layer stack 202L may include a plurality of dielectric layers 202A. The word line stack WL may include a plurality of word lines WL1, WL2, and WL3. The plurality of dielectric layers 202A and the plurality of word lines WL1, WL2, and WL3 may be alternately stacked. The plurality of first vertical channel structures CP1 may be formed through the first dielectric stack 202L and the word line stack WL. The word line stack WL may have a shape that surrounds the first vertical channel structure CP1. The first vertical channel structure CP1 may include a first memory layer 205 and a first channel layer 206. The first channel layer 206 may have an internal space filled with a first core dielectric layer 207. A first pad 208 may be formed on the first core dielectric layer 207. The first pad 208 may be electrically coupled to the first channel layer 206. Neighboring word line stacks WL may be divided on a block basis by a slit 214. One block may include one word line stack WL and a plurality of first vertical channel structures CP1. In one block, the plurality of first vertical channel structures CP1 may share one word line stack WL. The plurality of first vertical channel structures CP1 and the word line stack WL may serve as a part of a cell string. The isolating layer 213 may also be referred to as a slit.

The second dielectric layer stack 202U may include a plurality of dielectric layers 202б. The select gate stack SG may include a plurality of select gate electrodes SG1, SG2, and SG3, which are vertically positioned. The plurality of dielectric layers 20213 and the plurality of select gate electrodes SG1, SG2, and SG2 may be alternately stacked. The plurality of second vertical channel structures CP2 may be formed through the second dielectric stack 202U and the select gate stack SG. The select gate stack SG may have a shape that surrounds the second vertical channel structure CP2. The second vertical channel structure CP2 may include a second memory layer 209 and a second channel layer 210. The second channel layer 210 may have a cylindrical shape. The second channel layer 210 may have an internal space filled with a second core dielectric layer 211. A second pad 212 may be formed on the second core dielectric layer 211. The second pad 212 may be electrically coupled to the second channel layer 210. The first channel layer 206 and the second channel layer 210 may be electrically coupled through the first pad 208.

The laterally neighboring select transistors SGT1 and SGT2 may be isolated from each other by the isolating layer 213. Each of the select transistors SGT1 and SGT2 may include the select gate stack SG. Therefore, the select gate stacks SG of the neighboring select transistors SGT1 and SGT2 may be isolated from each other by the isolating layer 213. The isolating layer 213 may be positioned at the boundary between the select transistors SGT1 and SGT2. The select gate electrodes SG1, SG2, and SG3 may have a shape that surrounds the plurality of second vertical channel structures CP2. The select gate electrodes SG1, SG2, and SG3 and the second vertical channel structures CP2 may serve as a part of the select transistor SGT1 or SGT2 for selecting a cell string. The select gate electrodes SG1, SG2, and SG3 may be referred to as a drain select line DSL. Although not illustrated, the bottom structure 201 may include a source select line SSL.

The isolating layer 213 may have a limited depth so that the isolating layer 213 does not isolate the word line stack WL. The bottom surface of the isolating layer 213 may be positioned in the first buffer layer 203L.

The plurality of second vertical channel structures CP2 may include a plurality of edge vertical channel structures ECP2 and a plurality of internal vertical channel structures ICP2. The edge vertical channel structures ECP2 may directly contact the isolating layer 213. The plurality of edge vertical channel structures ECP2 may be partially surrounded by the select gate stack SG. A portion of the sidewall of each of the edge vertical channel structures ECP2 may contact the select gate stack SG, and the other portion of the sidewall of the edge vertical channel structure ECP2 may contact the isolating layer 213. One wall surface of the select gate stack SG may have a zigzag shape and contact the isolating layer 213. The other wall surface of the select gate stack SG may have a linear shape and contact the slit 214.

The distance between the internal vertical channel structures ICP2 may be uniform. The distance between the edge vertical channel structures ECP2 may be uniform. Furthermore, the distance between the edge vertical channel structures ECP2 may be equal to the distance between the internal vertical channel structures ICP2. Therefore, the plurality of second vertical channel structures CP2 may be arrayed with a substantially uniform distance provided therebetween. The uniform distance may be based on the fourth direction X1 and the fifth direction X2. For example, the distance between the center axes of the internal vertical channel structures ICP2 may be equal to the distance between the center axes of the edge vertical channel structures ECP2.

The isolating layer 213 may correspond to the isolating layer 140 of FIGS. 1A to 1D. The isolating layer 213 may be formed in a similar manner to the method illustrated by FIGS. 2A to 3M.

According to the above-described structure, the isolating layer 213 may have a zigzag shape or wave shape. Such an isolating layer 213 may minimize the isolating space W between the neighboring select transistors SGT1 and SGT2. Therefore, because the size of the block BLK can be reduced, the degree of integration of the vertical NAND 200 can be improved. Furthermore, because a separate space for forming the isolating layer 213 is not needed, the block size can be reduced to thereby expect bit growth.

The vertical NAND 200 may include the isolating layer 213 for isolating the select transistors SGT1 and SGT2. Because the isolating layer 213 does not occupy a separate space between the select transistors SGT1 and SGT2, the block size can be reduced.

Figure 4E:
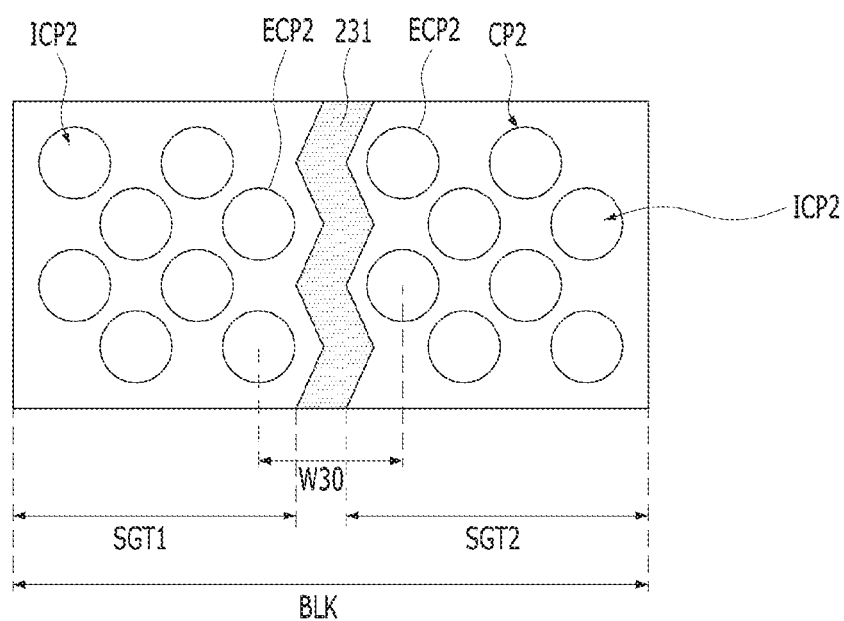
FIG. 4E shows a plan view illustrating a vertical NAND in accordance with a comparative example.

FIG. 4E shows a plan view illustrating a vertical NAND in accordance with a comparative example.

Referring to FIG. 4E, the vertical NAND 230 in accordance with the comparative example may include an isolating layer 231. When the isolating layer 231 occupies a separate space between the edge vertical channel structures ECP2, the distance between the edge vertical channel structures ECP2 may be increased. For example, the distance W30 between the center axes of the edge vertical channel structures ECP2 may be increased.

In the present embodiments, however, because the isolating layer 213 is formed so as to contact the edge vertical channel structures ECP2, the distance W20 between the center axes of the edge vertical channel structures ECP2 may be decreased.

As a result, the distance S1 between the internal vertical channel structures ICP2 and the distance S1 between the edge vertical channel structures ECP2 may be uniformly maintained. Therefore, the distances between the respective second vertical channel structures CP2 may be all uniformly maintained.

FIGS. 5A to 5M show diagrams for describing an example of a method for fabricating a vertical NAND. FIGS. 5A to 5M show diagrams for describing a method for fabricating a portion 250 of FIG. 4B.

Figure 5A:
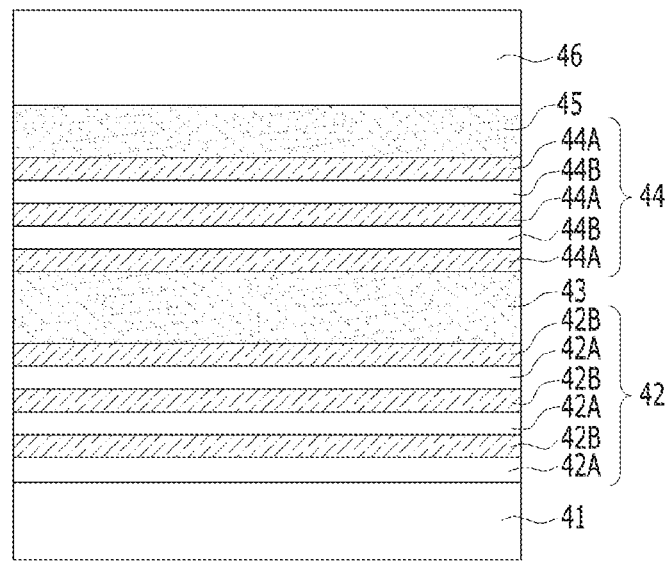
FIGS. 5A to 5M show diagrams for describing an example of a method for fabricating a vertical semiconductor device.

As illustrated in FIG. 5A, a first alternating stack 42, a first buffer layer 43, a second alternating stack 44, a second buffer layer 45, and a capping layer 46 may be formed over a bottom structure 41. The first buffer layer 43 may be formed between the first and second alternating stacks 42 and 44, and the second buffer layer 45 may be formed between the second alternating stack 44 and the capping layer 46.

The bottom structure 41 may include a semiconductor substrate. The bottom structure 41 may include a source region formed in the semiconductor substrate through impurity implantation. The bottom structure 41 may include a source region formed through a process of forming a doped polysilicon layer on the semiconductor substrate and then patterning the doped polysilicon layer. The bottom structure 41 may include a pipe gate having a pipe trench formed therein. The bottom structure 41 may include the semiconductor substrate and an etch stop layer formed on the semiconductor substrate.

The first alternating stack 42 may include a plurality of dielectric layers 42A and a plurality of sacrificial layers 42B. The second alternating stack 44 may include a plurality of dielectric layers 44B and a plurality of sacrificial layers 44A. The dielectric layers 42A and 44B may include a dielectric material, and the sacrificial layers 42B and 44A may include a sacrificial material. Here, 'sacrificial material' may indicate a material which is to be removed in a subsequent process. The dielectric layers 42A and 44B may include one or more dielectric materials, such as silicon oxide, silicon nitride, silicon oxynitride, spin-on dielectric material, dielectric metal oxide, silicate, and dielectric metal oxynitride.

The sacrificial layers 42B and 44A may include a sacrificial material which can be removed selectively with respect to the dielectric layers 42A and 44B. The removal process of the sacrificial layers 42B and 44A may be performed selectively with respect to the dielectric layers 42A and 44B. The ratio of the removal rate of the sacrificial layers 42B and 44A to the removal rate of the dielectric layers 42A and 44B may be referred to as the selectivity of the removal process of the sacrificial layers 42B and 44A with respect to the dielectric layers 42A and 44B.

The sacrificial layers 42B and 44A may include a dielectric material. The sacrificial layers 42B and 44A may be replaced with a conductive material in a subsequent process. For example, the sacrificial layers 42B and 44A may be replaced with a control gate electrode of the vertical NAND. The sacrificial layers 42B and 44A may include silicon nitride, amorphous silicon, or polysilicon. In some embodiments, the sacrificial layers 42B and 44A may include silicon nitride.

In an embodiment, the dielectric layers 42A and 44B may include silicon oxide, and the sacrificial layers 42B and 44A may include silicon nitride.

The dielectric layers 42A and 44B and the sacrificial layers 42B and 44A may be deposited by chemical vapor deposition (CVD) or atomic layer deposition (ALD).

The first and second buffer layers 43 and 45 may be thicker than the dielectric layers 42A and 44B and the sacrificial layers 42B and 44A. The first and second buffer layers 43 and 45 and the dielectric layers 42A and 44B may be formed of the same material.

In the first and second alternating stacks 42 and 44, the plurality of sacrificial layers 42B and 44A and the plurality of dielectric layers 42A and 44B may be alternately stacked multiple times.

The capping layer 46 may include a dielectric material. The capping layer 46 may be formed of the same material as the first and second buffer layers 43 and 45 and the dielectric layers 42A and 44B.

Figure 5B:
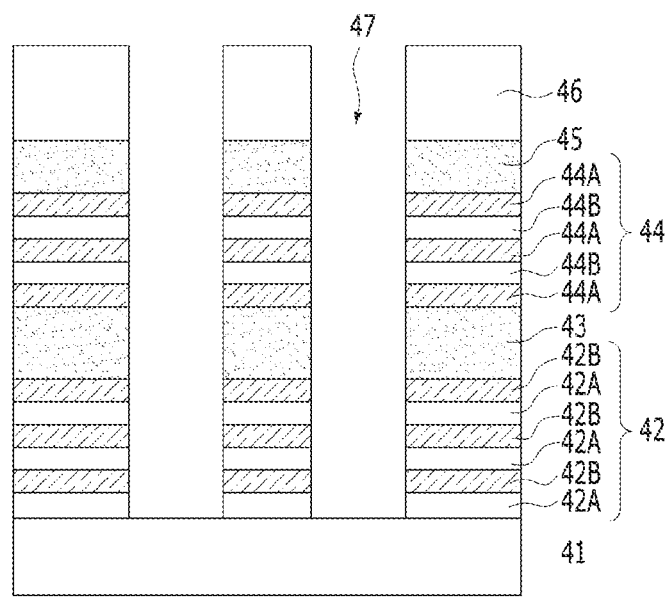

As illustrated in FIG. 5B, a channel hole 47 may be formed. The channel hole 47 may be formed by etching the first alternating stack 42, the first buffer layer 43, the second alternating stack 44, the second buffer layer 45, and the capping layer 46. The surface of the bottom structure 41 may be exposed at the bottom of the channel hole 47. The channel hole 47 may be formed vertically from the surface of the bottom structure 41. The channel hole 47 may be referred to as a 'vertical recess.'

Although not illustrated, a plurality of channel holes 47 may be formed to have a hole array structure, when viewed from the top. When the channel holes 47 are formed, the surface of the bottom structure 41 may be over-etched. The plurality of channel holes 47 may be arrayed with a substantially uniform distance between them. As used herein, a substantially uniform distance provided between vertical channel structures CP2 or between channel holes 47 means a distance that varies by less than ten percent (10%) of its value when considered between individual vertical channel structures CP2 or channel holes 47.

Figure 5C:
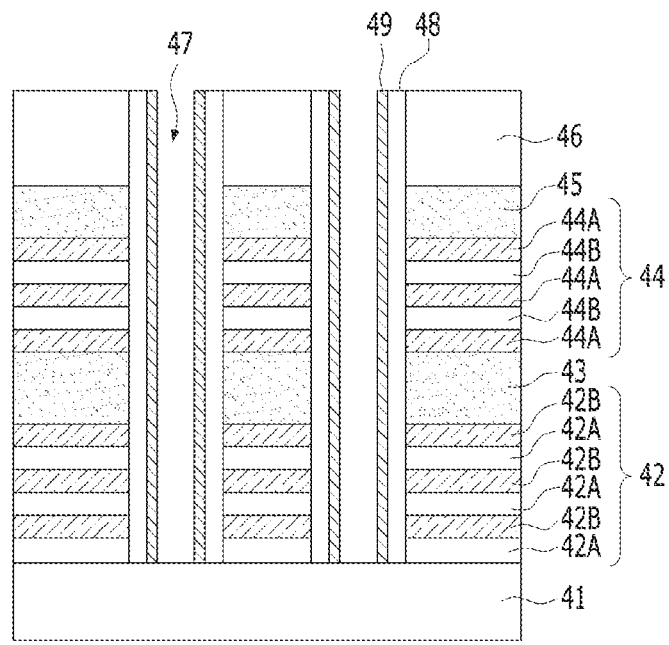

As illustrated in FIG. 5C, a first memory layer 48 and a first channel layer 49 may be formed in the channel hole 47. The first memory layer 48 and the first channel layer 49 may be formed in a spacer shape.

The first memory layer 48 may include a tunnel dielectric layer, a charge storage layer, and a blocking layer. The first memory layer 48 may include a stack of oxide and nitride. The first memory layer 48 may include an ONO stack. The first memory layer 48 may have a spacer shape. The first memory layer 48 may be formed on the sidewall of the channel hole 47. The bottom of the first memory layer 48 may contact the top surface of the bottom structure 41. The top surface of the first memory layer 48 may have the same level as the top surface of the capping layer 46. When viewed from the top, the first memory layer 48 may be formed in a ring shape to surround the sidewall of the channel hole 47.

The first channel layer 49 may include a silicon layer. The first channel layer 49 may include a doped silicon layer. The bottom of the first channel layer 49 may contact the bottom structure 41.

The first memory layer 48 and the first channel layer 49 may be referred to as a lower memory layer and a lower channel layer, respectively. The channel hole 47 may be referred to as a lower channel hole.

Figure 5D:
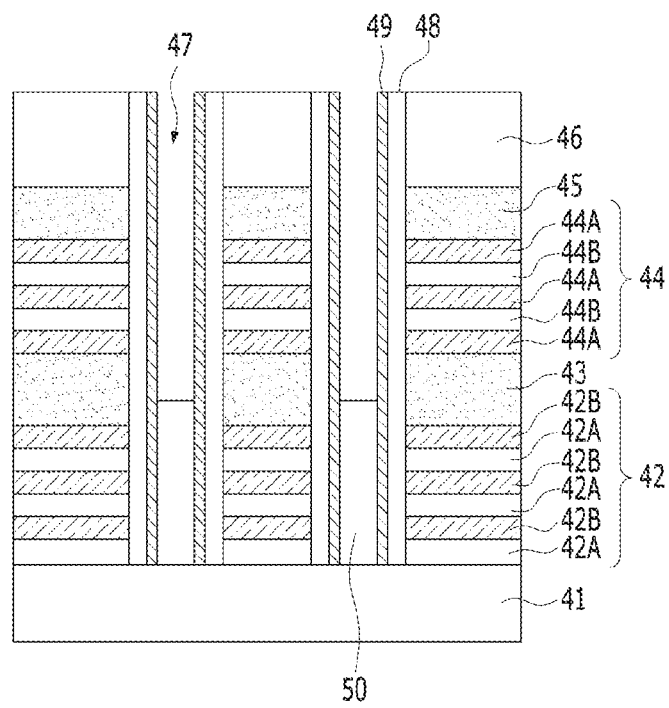

As illustrated in FIG. 5D, the internal space of the channel hole 47 may be filled with a first core dielectric layer 50. The first core dielectric layer 50 may include silicon oxide or silicon nitride. The first core dielectric layer 50 may partially fill the channel hole 47 over the first channel layer 49 and the first memory layer 48.

Figure 5E:
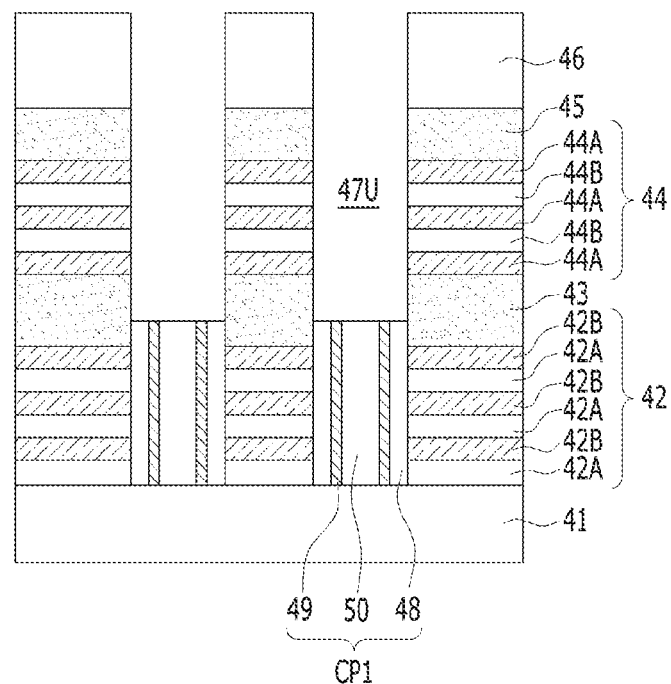

As illustrated in FIG. 5E, an upper region 47U of the channel hole 47 may be exposed. The first memory layer 48 and the first channel layer 49 may be selectively etched. The top surfaces of the first memory layer 48 and the first channel layer 49 may have the same level as the top surface of the first core dielectric layer 50. A first vertical channel structure CP1 may be formed in a lower region of the channel hole 47. The first vertical channel structure CP1 may include a first memory layer 48, a first channel layer 49, and a first core dielectric layer 50. The first vertical channel structure CP1 may correspond to the first vertical channel structure CP1 of FIGS. 4A to 4D.

Figure 5F:
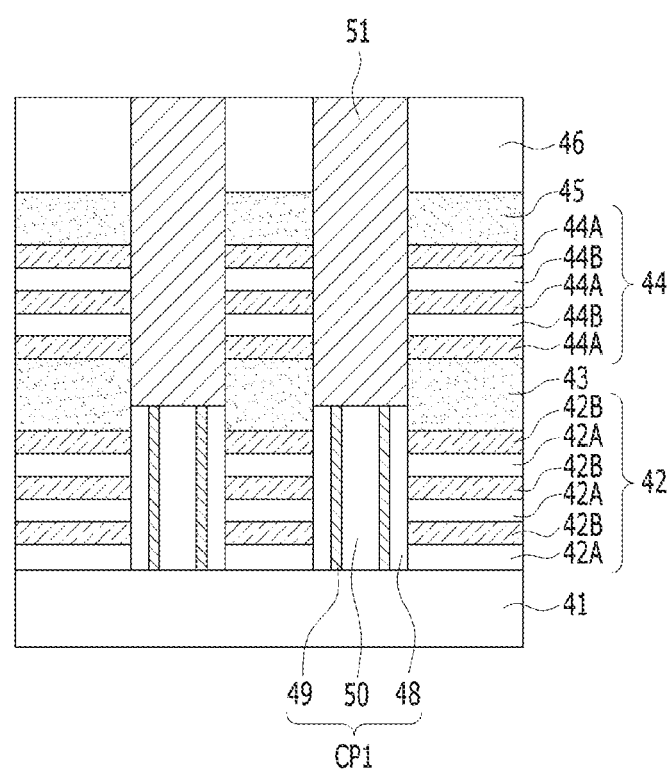

As illustrated in FIG. 5F, the upper region 47U of the channel hole 47 may be filled with a first pad material 51. The top surface of the first pad material 51 may have the same level as the top surface of the capping layer 46. The first pad material 51 may include a silicon-containing material. The first pad material 51 may include a conductive material. The first pad material 51 may include a silicon layer. The first pad material 51 may include a polysilicon layer. For example, a polysilicon layer may be deposited to fill the upper region 47U of the channel hole 47, and may then be planarized until the top surface of the capping layer 46 is exposed. Thus, the first pad material 51 including the pillar-shape polysilicon layer may be formed. In another embodiment, the first pad material 51 may include metal nitride. The metal nitride may be not only be used as an etch stop layer, but also used as an electrical path. The first pad material 51 may include titanium nitride.

Figure 5G:
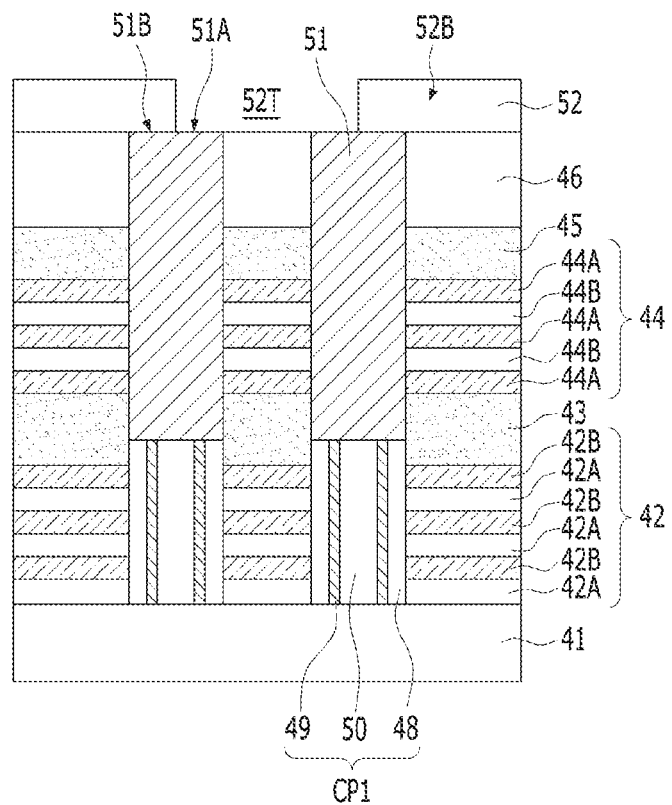

As illustrated in FIG. 5G, an isolating mask 52 may be formed. The isolating mask 52 may include a photoresist pattern. The isolating mask 52 may include an opening 52T and a blocking portion 52B. When viewed from the top, the opening 52T of the isolating mask 52 may have a line shape. The opening 52T may have a linear line shape or wave line shape. Through the opening 52T of the isolating mask 52, a portion of the first pad material 51 may be exposed. The blocking portion 52B of the isolating mask 52 may cover the other portion of the first pad material 51. When any one first pad material 51 is considered, a portion 51A of the top surface of the first pad material 51 may be exposed through the opening 52T of the isolating mask 52, and the other portion 51B of the top surface of the first pad material 51 may be covered by the blocking portion 52B of the isolating mask 52. The sidewalls of the opening 52T of the isolating mask 52 may include linear shape sidewalls and round shape sidewalls, as in above-described embodiments.

When the isolating mask 52 is formed, the opening 52T may partially overlap the first pad material 51 thereunder. In other words, because the opening 52T is not positioned between the neighboring first pad materials 51, the space of the opening 52T does not need to be additionally spared.

Figure 5H:
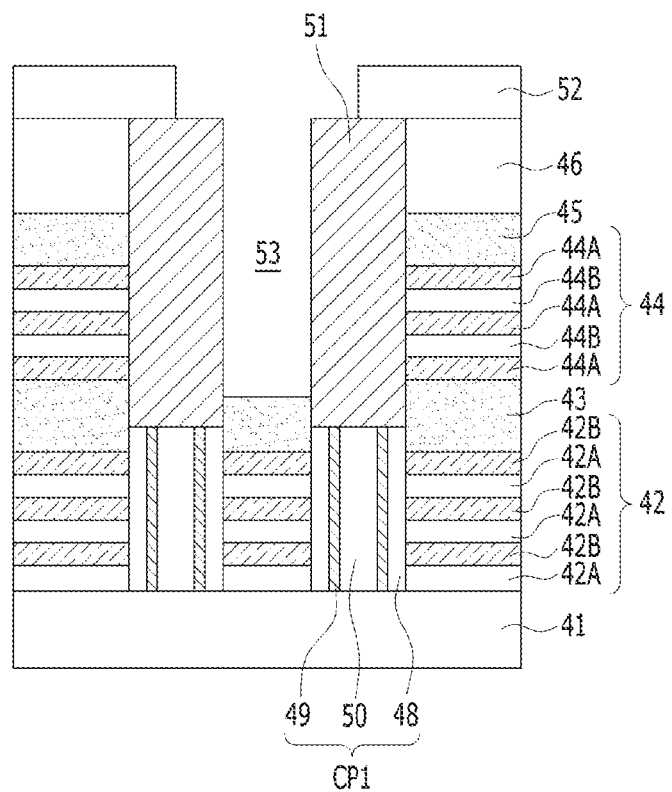

As illustrated in FIG. 5H, an isolating trench 53 may be formed. In order to form the isolating trench 53, the capping layer 46, the second buffer layer 45, and the second alternating stack 44 may be etched through the isolating mask 52 serving as an etch barrier. During the etch process for forming the isolating trench 53, the first pad material 51 may be used as an etch barrier. Therefore, the isolating trench 53 may be self-aligned with the first pad material 51. The isolating trench 53 may be formed between the neighboring first pad materials 51.

When viewed from the top, the isolating trench 53 may have a line shape. The isolating trench 53 may have a linear line shape or wave line shape. The sidewall of the first pad material 51 may be partially exposed by the isolating trench 53. The sidewalls of the plurality of first pad materials 51 may be partially exposed by one isolating trench 53.

During the etch process for forming the isolating trench 53 as described above, the first pad material 51 may be used as an etch stop layer. Therefore, the capping layer 46, the second buffer layer 45, and the second alternating stack 44 may be etched in such a manner that the isolating trench 53 is self-aligned with the sidewall of the first pad material 51.

In various embodiments, because the isolating trench 53 is self-aligned with the channel hole 47 having the first pad material 51 formed therein during the etch process for forming the isolating trench 53, the space for forming the isolating trench 53 does not need to be additionally set.

In a comparative example, when the space for forming the isolating trench 53 is set between the vertical channel structures, an etch margin of the channel hole 47 may be reduced.

The bottom surface of the isolating trench 53 may be extended within the first buffer layer 43.

The isolating trench 53 may include linear shape sidewalls and round shape sidewalls as in above-described embodiments.

Through the isolating trench 53, the structure may be divided into first and second regions with no reference numerals. Each of the first and second regions may include a plurality of first pad materials 51. The first and second regions may indicate regions in which the neighboring select transistors SGT1 and SGT2 are to be formed (refer to FIG. 4A).

Figure 5I:
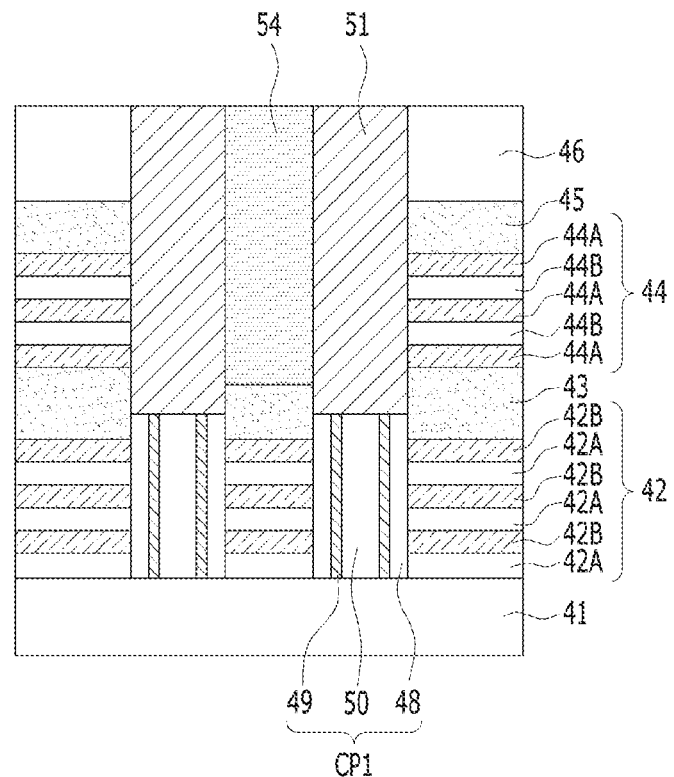

As illustrated in FIG. 5I, the isolating mask 52 may be removed. An isolating layer 54 may be formed in the isolating trench 53. The isolating layer 54 may include a dielectric material. The isolating layer 54 and the first pad material 51 may be formed of different materials. The isolating layer 54 may include silicon oxide. In order to form the isolating layer 54, silicon oxide may be deposited to fill the isolating trench 53, and may then be planarized. The isolating layer 54 may be formed in the isolating trench 53, and may be absent from the top surface of the capping layer 46. The top surface of the isolating layer 54 and the top surface of the capping layer 46 may have the same level.

Figure 5J:
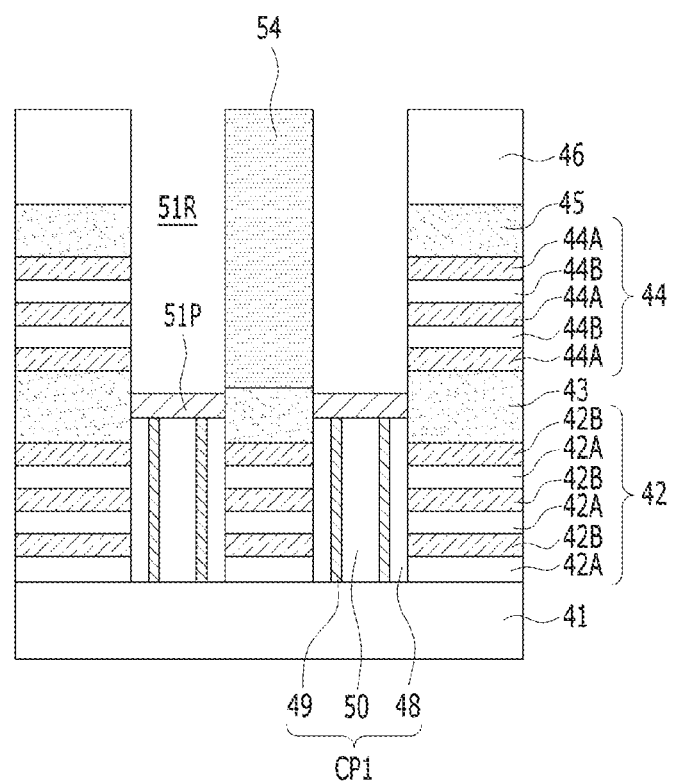

As illustrated in FIG. 5J, a part of the first pad material 51 may be recessed. Thus, a first pad 51P may be formed, and a recess 51R may be formed over the first pad 51P. The first pad 51P may contact the channel layer 49. The first pad 51P may have a smaller thickness than the first buffer layer 43. The top surface of the first pad 51P may have a lower level than the top surface of the first buffer layer 43. In order to form the first pad 51P, the first pad material 51 may be wet-etched. When the first pad material 51 is wet-etched, the isolating layer 54, the capping layer 46, the second buffer layer 45, and the second alternating stack 44 might not etched.

When viewed from the top, the recess 51R may have a circular shape. The neighboring recesses 54R may be isolated by the isolating layer 54.

The recess 51R may be referred to as an upper channel hole.

Figure 5K:
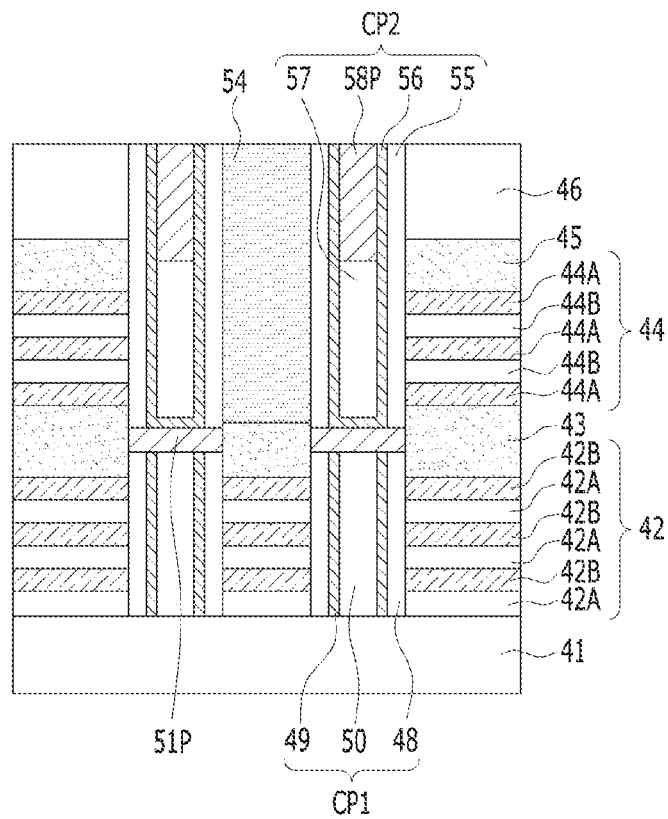

As illustrated in FIG. 5K, a second vertical channel structure CP2 may be formed in the recess 51R. The second vertical channel structure CP2 may include a second memory layer 55, a second channel layer 56, a second core dielectric layer 57, and a second pad 58P. The first vertical channel structure CP1, the first pad 51P, and the second vertical channel structure CP2 are sequentially stacked.

In order to form the second vertical channel structure CP2, the second memory layer 55 and the second channel layer 56 may be sequentially formed. Subsequently, the second core dielectric layer 57 may be formed, and the second memory layer 55, the second channel layer 56, and the second core dielectric layer 57 may be planarized until the surface of the capping layer 46 is exposed. The second memory layer 55, the second channel layer 56, and the second core dielectric layer 57 may be formed of the same materials as the first memory layer 48, the first channel layer 49, and the first core dielectric layer 50, respectively.

The second memory layer 55 may include a tunnel dielectric layer, a charge storage layer, and a blocking layer. The second memory layer 55 may include a stack of oxide and nitride. The second memory layer 55 may include an ONO stack. The second memory layer 55 may have a spacer shape, and the bottom of the second memory layer 55 may contact the first pad 51P. The top surface of the second memory layer 55 may have the same level as the top surface of the capping layer 46. The second channel layer 56 may include a silicon layer. The second channel layer 56 may include a doped silicon layer. The second channel layer 56 may have a cylindrical shape, and the bottom of the second channel layer 56 may contact the first pad 51P.

The second memory layer 55 and the second channel layer 56 may be referred to as an upper memory layer and an upper channel layer, respectively.

The internal space of the second channel layer 56 may be filled with the second core dielectric layer 57. The second core dielectric layer 57 may include silicon oxide or silicon nitride. The second core dielectric layer 57 may partially fill the recess 51R over the second channel layer 56.

The second pad 58P may include a silicon layer or metal nitride. The metal nitride may be not only used as an etch stop layer, but also used as an electrical path. The second pad 58P may include titanium nitride. For example, titanium nitride may be deposited on the second channel layer 56 so as to fill the recess 51R, and then be planarized until the top surface of the capping layer 46 is exposed. Thus, a pillar-shaped second pad 58P including titanium nitride may be formed.

The second vertical channel structure CP2 may correspond to the second vertical channel structure CP2 of FIGS. 4A to 4D. Therefore, the second vertical channel structure CP2 may include a plurality of edge vertical channel structures and internal vertical channel structures. The plurality of second vertical channel structures CP2 may be arrayed with a uniform distance between them. The isolating layer 54 may have a zigzag shape or wave shape. Thus, the distances between the respective second vertical channel structures CP2 may be all uniformly maintained.

Figure 5L:
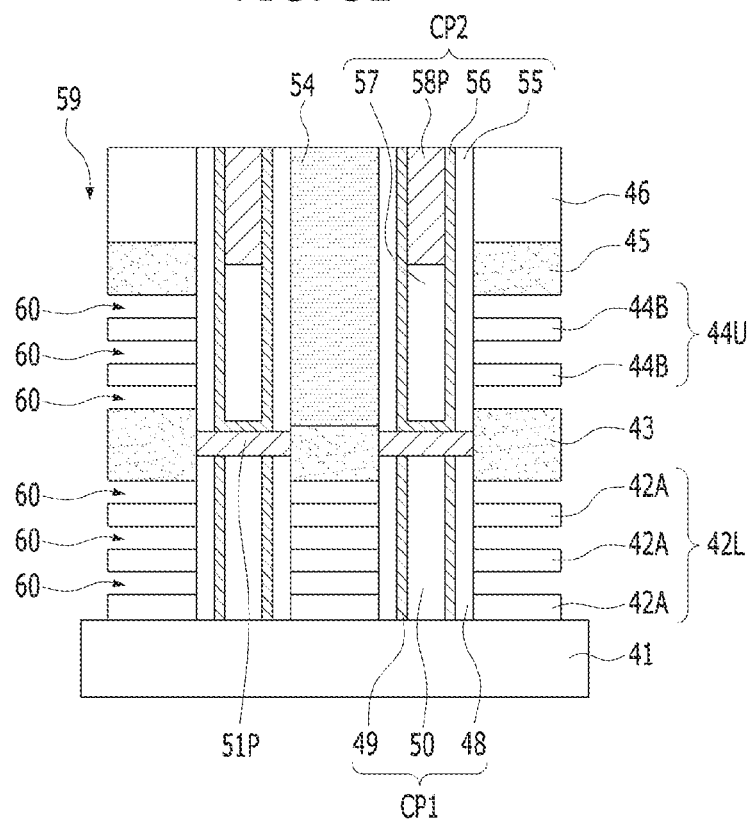

As illustrated in FIG. 5L, a slit 59 may be formed, and sacrificial layers 42B and 44A may be selectively removed. Thus, a plurality of lateral recesses 60 may be formed. As the sacrificial layers 42B and 44A are removed, a lower dielectric layer stack 42L and an upper dielectric layer stack 44U may be formed. The lower dielectric layer stack 42L may include dielectric layers 42A, and a plurality of lateral recesses 60 may be positioned between the respective dielectric layers 42A. The upper dielectric layer stack 44U may include dielectric layers 44B, and a plurality of lateral recesses 60 may be positioned between the respective dielectric layers 44B.

Figure 5M:
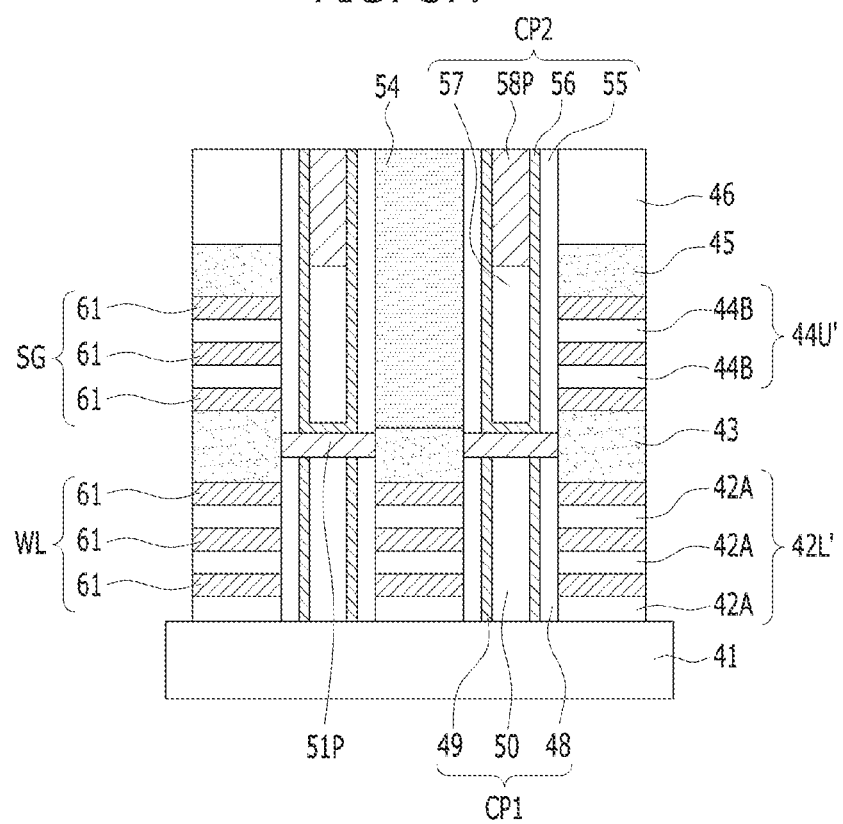

As illustrated in FIG. 5M, the lateral recesses 60 may be filled with a conductive material 61, such as tungsten. Therefore, a lower stacked structure 42L' in which the dielectric layers 42A and the conductive materials 61 are alternately positioned may be formed. Furthermore, an upper stacked structure 44U' in which the dielectric layers 44B and the conductive materials 61 are alternately positioned may be formed. The conductive materials 61 of the lower stacked structure 42L' may be referred to as a word line. The conductive materials 61 of the upper stacked structure 44U' may be referred to as a select gate electrode SG. The select gate electrode SG may also be referred to as a drain select line DSL. The laterally neighboring select gate electrodes SG may be isolated by the isolating layer 54.

Figure 6:
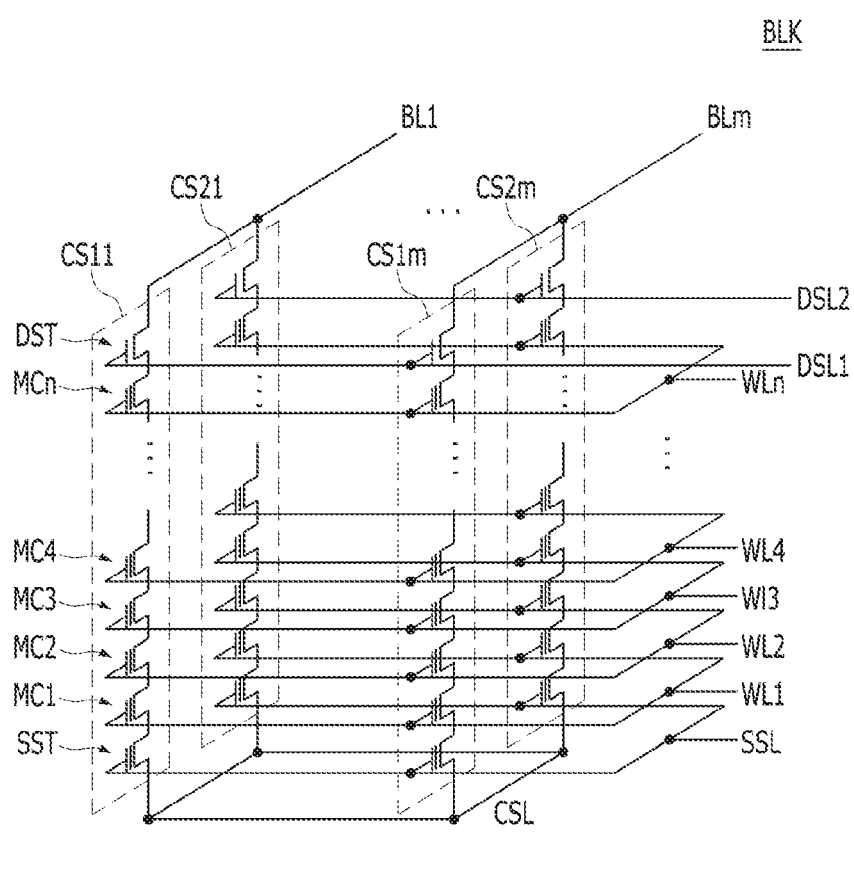
FIG. 6 shows a circuit diagram of a memory block in accordance with an embodiment.

FIG. 6 shows a circuit diagram of a memory block BLK in accordance with an embodiment.

A semiconductor device may include a memory cell array divided into a plurality of memory blocks. Each of the memory blocks may include memory cells arranged in a three-dimensional manner. Each of the memory blocks may have an alternating stack structure including two or more layers.

The structure of each of the memory blocks is described as follows.

The memory block BLK may include memory cells MC1 to MCn arranged in extension directions of first to third axes I to III. The first to $n^{th}$ memory cells MC1 to MCn stacked in line along the extension direction of the third axis III may be coupled in series to any one of cell strings CS11 to CS1$m$ and CS21 to CS2$m$. Each of the cell strings CS11 to CS1$m$ and CS21 to CS2$m$ may further include a source select transistor SST coupled in series to the first memory cell MC1 and a drain select transistor DST coupled in series to the $n^{th}$ memory cell MCn. The first to $n^{th}$ memory cells MC1 to MCn may be arranged between the source select transistor SST and the drain select transistor DST.

Each of the cell strings CS11 to CS1$m$ and CS21 to CS2$m$ may include one or more source select transistors SST. The source select transistor SST may be stacked under the first memory cell MC1 and electrically coupled to the first memory cell MC1. Although not illustrated in FIG. 6, two or more layers of source select transistors SST coupled in series may be stacked under the first memory cell MC1. The source select transistor SST may be electrically coupled to a common source line CSL. The common source line CSL may be positioned under the source select transistor SST.

Each of the cell strings CS11 to CS1$m$ and CS21 to CS2$m$ may include one or more drain select transistors DST. The drain select transistor DST may be stacked on the $n^{th}$ memory cell MCn and electrically coupled to the $n^{th}$ memory cell MCn. Although not illustrated in FIG. 6, two or more drain select transistors DST coupled in series may be stacked over the $n^{th}$ memory cell MCn. The drain select transistor DST may be electrically coupled to any one of bit lines BL1 to BL$m$. The bit lines BL1 to BL$m$ may be disposed over the drain select transistor DST.

The gates of the first to $n^{th}$ memory cells MC1 to MCn may be coupled to the first to $n^{th}$ word lines WL1 to WL$n$, respectively. The first to $n^{th}$ word lines WL1 to WL$n$ may be positioned at different levels.

The gates of the source select transistors SST of the cell strings CS11 to CS1$m$ and CS21 to CS2$m$ may be coupled to the source select line SSL. The source select line SSL may be positioned at a lower level than the first to $n^{th}$ word lines WL1 to WL$n$.

The bit lines BL1 to BL$m$ may be spaced apart from each other and arranged in the extension direction of the first axis I. The cell strings CS11 to CS1$m$ and CS21 to CS2$m$ may be divided into first to $m^{th}$ columns arranged in the extension direction of the first axis I. The first to $m^{th}$ columns of the cell strings CS11 to CS1$m$ and CS21 to CS2$m$ may be coupled to the bit lines BL1 to BL$m$ corresponding to the first to $m^{th}$ columns. For example, the cell strings CS11 and CS21 of the first column may be coupled to the first bit line BL1, and the cell strings CS1$m$ and CS2$m$ of the $m^{th}$ column may be coupled to the $m^{th}$ bit line BL$m$.

The cell strings CS11 to CS1$m$ and CS21 to CS2$m$ may be divided into first and second groups arranged in the extension direction of the second axis II crossing the first axis I. The first and second groups of the cell strings CS11 to CS1$m$ and CS21 to CS2$m$ may be coupled to first and second drain select lines DSL1 and DSL2, respectively. For example, drain select transistors DST included in the first cell strings CS11 to CS1$m$ of the first group may be coupled to the first drain select line DSL1, and drain select transistors DST included in the cell strings CS21 to CS2$m$ of the second group may be coupled to the second drain select line DSL2. The cell strings CS11 to CS1$m$ of the first group and the cell strings CS21 to CS2$m$ of the second group may be arranged in a zigzag shape.

The cell strings CS11 to CS1m and CS21 to CS2m may be electrically coupled to the common source line CSL and the bit lines BL1 to BLm through channel layers. The common source line CSL and the cell strings CS11 to CS1m and CS21 to CS2m may be implemented through stacked structures having various structures.

The drain select transistor DST of FIG. 6 may correspond to the select transistors SGT1 and SGT2 of FIGS. 4A to 4D.

In accordance with the present embodiments, because the isolating space between the neighboring vertical channel structures is not needed, the block size can be reduced.

Furthermore, because the isolating space between the select transistors is not needed, the block size of the vertical NAND can be reduced to thereby improve the reliability of the vertical NAND.

Furthermore, because the distance between the vertical channel structures is constantly maintained, etch loading can be improved.

Although various embodiments have been described for illustrative purposes, it will be apparent to those skilled in the art that various changes and modifications may be made without departing from the spirit and scope of the present teachings as defined in the following claims.

What is claimed is:

1. A semiconductor device comprising:
   a first stacked structure comprising word lines and dielectric layers alternately stacked over a substrate;
   a plurality of first vertical channel structures formed through the first stacked structure;
   a second stacked structure including gate electrodes and dielectric layers alternately stacked over the first stacked structure;
   a plurality of second vertical channel structures formed through the second stacked structure, wherein the plurality of second vertical channel structures are respectively connected to the plurality of first vertical channel structures; and
   an isolating layer for isolating the plurality of second vertical channel structures into first and second regions,
   wherein both sidewalls of the isolating layer contact sidewalls of second vertical channel structures of the plurality of second vertical channel structures positioned at the boundary between the first and second regions.

2. The semiconductor device of claim 1, wherein each of both of the sidewalls of the isolating layer comprises linear shape sidewalls and round shape sidewalls which are continuous with each other.

3. The semiconductor device of claim 2, wherein the round shape sidewalls contact sidewalls of the second vertical channel structures positioned at the boundary between the first and second regions.

4. The semiconductor device of claim 1, wherein the isolating layer comprises a dielectric material.

5. The semiconductor device of claim 1, wherein the first vertical channel structures are a part of a cell string, and wherein the second vertical channel structures are a part of a select transistor for selecting the cell string.

6. A semiconductor device comprising:
   a stacked structure comprising gate electrodes and dielectric layers alternately stacked over a substrate, the stacked structure having a first edge sidewall extending in a first direction parallel to the substrate;
   a plurality of first edge vertical channel structures formed through the first edge sidewall of the stacked structure in a second direction perpendicular to the substrate,
   wherein sidewalls of the plurality of first edge vertical channel structures are partially surrounded by the first edge sidewall; and
   internal vertical channel structures spaced apart from the first edge vertical channel structures and formed through the stacked structure,
   wherein the internal vertical channel structures are isolated from each other in a third direction which is parallel to the substrate and crosses the first direction, and
   wherein the sidewalls of the internal vertical channel structures are completely surrounded by the stacked structure.

7. The semiconductor device of claim 6, wherein the first edge sidewall comprises linear shape sidewalls and round shape sidewalls which are continuous with each other in the first direction.

8. The semiconductor device of claim 7, wherein the round shape sidewalls of the first edge sidewall contact respective sidewalls of the plurality of first edge vertical channel structures.

9. The semiconductor device of claim 7, wherein the round shape sidewalls of the first edge sidewall vertically extend in the second direction.

10. The semiconductor device of claim 6, wherein the stacked structure further comprises a second edge sidewall extending in the first direction parallel to the substrate and spaced apart from the first edge sidewall.

11. The semiconductor device of claim 10, wherein the second edge sidewall comprises linear shape sidewalls and round shape sidewalls which are continuous with each other in the first direction.

12. The semiconductor device of claim 11, wherein the round shape sidewalls of the second edge sidewall vertically extend in the second direction.

13. The semiconductor device of claim 11, further comprising a plurality of second edge vertical channel structures contacting the round shape sidewalls of the second edge sidewall,
   wherein the second edge vertical channel structures are spaced apart from the first edge vertical channel structures and the internal vertical channel structures.

14. The semiconductor device of claim 13, wherein a distance between the first edge vertical channel structures and the second edge vertical channel structures is equal to a distance between the internal vertical channel structures, and
   wherein the first edge vertical channel structures, the second edge vertical channel structures, and the internal vertical channel structures are arrayed uniformly with repeated intervals.

15. The semiconductor device of claim 13, further comprising an isolating layer formed between the first edge vertical channel structures and the second edge vertical channel structures.

16. The semiconductor device of claim 15, wherein the isolating layer comprises a plurality of round shape sidewalls, and wherein the round shape sidewalls contact the first edge vertical channel structures and the second edge vertical channel structures.

* * * * *